US011387242B2

(12) United States Patent
Chen et al.

(10) Patent No.: US 11,387,242 B2
(45) Date of Patent: *Jul. 12, 2022

(54) NON-VOLATILE MEMORY (NVM) CELL STRUCTURE TO INCREASE RELIABILITY

(71) Applicant: Taiwan Semiconductor Manufacturing Co., Ltd., Hsin-Chu (TW)

(72) Inventors: Shih-Hsien Chen, Zhubei (TW); Chun-Yao Ko, Hsinchu (TW); Felix Ying-Kit Tsui, Cupertino, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/068,924

(22) Filed: Oct. 13, 2020

(65) Prior Publication Data

US 2021/0280592 A1     Sep. 9, 2021

Related U.S. Application Data

(63) Continuation-in-part of application No. 16/807,537, filed on Mar. 3, 2020, now Pat. No. 11,152,383.

(51) Int. Cl.
*G11C 16/04* (2006.01)
*H01L 27/11524* (2017.01)
(Continued)

(52) U.S. Cl.
CPC .. *H01L 27/11524* (2013.01); *H01L 27/11529* (2013.01); *H01L 27/11531* (2013.01);
(Continued)

(58) Field of Classification Search
CPC ........ H01L 27/11524; H01L 27/11529; H01L 27/11531; H01L 29/0649; H01L 29/66825; H01L 29/7883
See application file for complete search history.

(56) References Cited

U.S. PATENT DOCUMENTS 5,124,765 A    6/1992 Kim et al.
6,788,574 B1   9/2004 Han et al.
(Continued)

FOREIGN PATENT DOCUMENTS

TW     201933352 A    8/2019

OTHER PUBLICATIONS

Non-Final Office Action dated Feb. 1, 2021 for U.S. Appl. No. 16/807,537.
U.S. Appl. No. 16/807,537, filed Mar. 3, 2020.

*Primary Examiner* — Pho M Luu
(74) *Attorney, Agent, or Firm* — Eschweiler & Potashnik, LLC

(57) ABSTRACT

An integrated chip includes a first well region, second well region, and third well region disposed within a substrate. The second well region is laterally between the first and third well regions. An isolation structure is disposed within the substrate and laterally surrounds the first, second, and third well regions. A floating gate overlies the substrate and laterally extends from the first well region to the third well region. A dielectric structure is disposed under the floating gate. A bit line write region is disposed within the second well region and includes source/drain regions disposed on opposite sides of the floating gate. A bit line read region is disposed within the second well region, is laterally offset from the bit line write region by a non-zero distance, and includes source/drain regions disposed on the opposite sides of the floating gate.

20 Claims, 18 Drawing Sheets

(51) Int. Cl.
*H01L 27/11529* (2017.01)
*H01L 29/66* (2006.01)
*H01L 29/06* (2006.01)
*H01L 29/788* (2006.01)
*H01L 27/11531* (2017.01)

(52) U.S. Cl.
CPC .... *H01L 29/0649* (2013.01); *H01L 29/66825* (2013.01); *H01L 29/7883* (2013.01)

(56) References Cited

U.S. PATENT DOCUMENTS

| | | | |
|---|---|---|---|
| 7,485,525 B2 | 2/2009 | Cheng et al. | |
| 9,698,261 B2* | 7/2017 | Wang | H01L 29/7889 |
| 9,793,211 B2* | 10/2017 | Peng | H01L 23/528 |
| 10,546,873 B2 | 1/2020 | Mehandru et al. | |
| 10,748,899 B2* | 8/2020 | Chen | H01L 29/78 |
| 11,152,383 B2* | 10/2021 | Chen | G11C 16/0408 |
| 2008/0266958 A1 | 10/2008 | Haggag et al. | |
| 2014/0361358 A1 | 12/2014 | Chen et al. | |
| 2015/0034909 A1 | 2/2015 | Horch | |
| 2016/0093628 A1 | 3/2016 | Chen et al. | |
| 2017/0011804 A1 | 1/2017 | La Rosa et al. | |
| 2017/0040058 A1 | 2/2017 | Shinagawa et al. | |
| 2018/0197613 A1 | 7/2018 | Hsu et al. | |
| 2019/0164981 A1 | 5/2019 | Chen et al. | |
| 2019/0267389 A1 | 8/2019 | Choi | |
| 2020/0035684 A1 | 1/2020 | Wang et al. | |

* cited by examiner

| Operation | $V_{SG}$ (V) | $V_{WL}$ (V) | $V_{EN}$ (V) | $V_{BL1}$ (V) | $V_{BL2}$ (V) | $V_{SL}$ (V) | $V_{BULK}$ (V) |
|---|---|---|---|---|---|---|---|
| Erase | 0 | 0 | HV | 0 | 0 | 0 | 0 |
| Program | 0 | HV | HV | 0 | ~HV/2 | 0 | 0 |
| Read | 5.0 | 1.5 | 0 | 0 | 1.2 | 0 | 0 |

| Operation | $V_{SG}$ (V) | $V_{WL}$ (V) | $V_{EN}$ (V) | $V_{BL1}$ (V) | $V_{BL2}$ (V) | $V_{SL}$ (V) | $V_{BULK}$ (V) |
|---|---|---|---|---|---|---|---|
| Erase | 0 | 0 | HV | 0 | 0 | 0 | 0 |
| Program | 0 | HV | HV | 0 | ~HV/2 | 0 | 0 |
| Read | 0 | 3.5 | 5 | 5 | 3.8 | 5 | 5 |

2000 ⇢

| Form an isolation structure in a substrate such that the isolation structure comprises a middle isolation segment disposed laterally between a first peripheral isolation segment and a second peripheral isolation segment | ─ 2002 |

| Form a first well region, a second well region, and a third well region within the substrate, where the second well region is laterally between the first and third well regions, and where the middle isolation segment of the isolation structure is disposed within the second well region | ─ 2004 |

| Form a floating gate (FG) and a select gate (SG) over the substrate, where the FG continuously laterally extends from the first well region to the third well region, where the SG overlies the second well region and the middle isolation segment of the isolation structure | ─ 2006 |

| Form a first capacitor active region, a bit line write region, a bit line read region, and a second capacitor active region within the substrate, thereby defining a plurality of transistors and a plurality of capacitors, where the bit line write and read regions are disposed within the second well region and are disposed on opposing sides of the middle isolation segment of the isolation structure | ─ 2008 |

| Form conductive vias and an interconnect dielectric structure over the substrate | ─ 2010 |

Fig. 20

NON-VOLATILE MEMORY (NVM) CELL STRUCTURE TO INCREASE RELIABILITY

REFERENCE TO RELATED APPLICATION

This Application is a Continuation-in-Part of U.S. application Ser. No. 16/807,537, filed on Mar. 3, 2020 (now U.S. Pat. No. 11,152,383, issued on Oct. 19, 2021), the contents of which are hereby incorporated by reference in their entirety.

BACKGROUND

Many modern electronic devices contain electronic memory configured to store data. Electronic memory may be volatile memory or non-volatile memory (NVM). Volatile memory stores data while it is powered, while NVM is able to keep data when power is removed. Multi-time programmable (MTP) cells are one promising candidate for next generation NVM. The MTP cells may be integrated with bipolar complementary metal-oxide-semiconductor (CMOS) double-diffused metal-oxide-semiconductor (DMOS) (BCD) technology and/or high voltage (HV) CMOS technology in system-on-chip (SoC) applications. Among other things, integrating the MTP cells with HV technology or BCD technology finds application in the internet of things (IoT), power management, smart cards, microcontroller units (MCUs), and automotive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 illustrates a flowchart of some embodiments of a second method for forming a memory device that includes a floating gate overlying a first bit line active region and a second bit line active region.

DETAILED DESCRIPTION

Figure 1A:
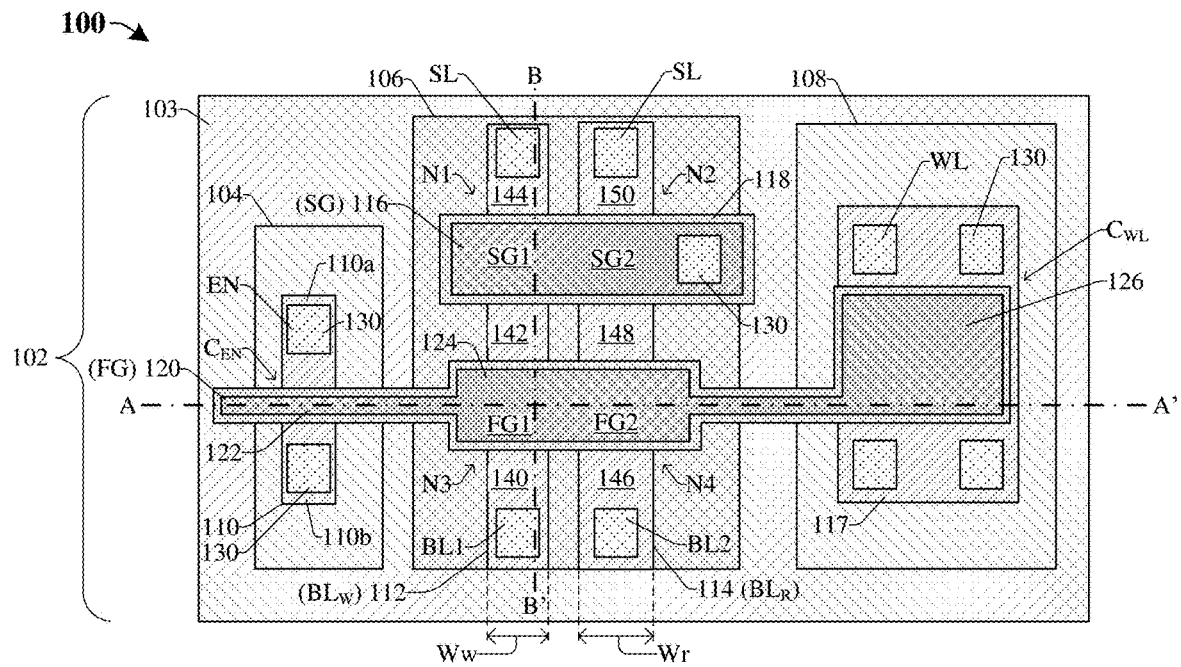
FIGS. 1A-1C illustrate various views of some embodiments of a memory cell including a floating gate overlying a first bit line active region and a second bit line active region.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip may include non-volatile memory (NVM) that is configured to retain stored information even when the integrated chip is not powered. A multi-time programmable (MTP) cell is one form of NVM that may include a plurality of transistors and a plurality of capacitors. For example, the MTP cell may include a storage transistor, a selector transistor, a coupling capacitor, and a tunneling capacitor, such that the MTP cell is in a two-transistor-two-capacitor (2T2C) configuration. The coupling capacitor, tunneling capacitor, and the storage transistor may share a floating gate. Further, a bit line may be coupled to a bit line active region disposed in a substrate underlying the floating gate. The floating gate may be separated from the substrate by a gate dielectric structure. The bit line active region is a discrete region of the substrate and is a part of the storage transistor. A proper bias voltage may be applied to the bit line active region to read a data value of the MTP cell or to write (e.g., erase or program) a data value of the MTP cell.

During operation, the MTP cell may be programmed and/or erased by Fowler-Nordheim (FN) tunneling. In an erase operation, stored electric charge within the floating gate may be removed from the floating gate to a first electrode of the tunneling capacitor by FN tunneling, thereby placing the MTP cell in a high resistance state. In a program operation, charge carriers (e.g., electrons) may be injected from the bit line active region into the floating gate by FN tunneling, thereby placing the MTP cell in a low resistance state. In a read operation, proper bias conditions are applied to the MTP cell such that a data state of the MTP cell may be accessed at a source/drain region within the bit line active region. However, during the erase or program operation, the charge carriers may be trapped within the gate dielectric structure and/or damage a crystal lattice of the gate dielectric structure. This in part may result in device failure after a number of programming operations, inaccurate read operations, and/or reduced device reliability. The inaccurate read operations may, for example, occur because the trapped charge carriers within the gate dielectric structure may be mistaken as a data state of the MTP cell. For example, in an application utilizing 110 nanometer (nm) transistors or less, the MTP cell may fail due to damage in the gate dielectric structure after about 10,000 program operations. In yet another example, in a high voltage application with 40 nm transistor(s), the MTP cell may fail due to damage to the gate dielectric structure after about 1,000 program operations.

Accordingly, in some embodiments, the present application is directed towards a NVM memory cell having a four-transistor-two-capacitor (4T2C) configuration with increased endurance and reliability. The NVM cell includes a coupling capacitor, a tunneling capacitor, a first storage transistor, a second storage transistor, a first selector transistor, and a second selector transistor. The coupling capacitor, tunneling capacitor, first storage transistor, and second storage transistor share a floating gate that overlies a substrate. A gate dielectric structure is disposed between the floating gate and the substrate. The first storage and selector transistors include a bit line write active region, while the second storage and selector transistors include a bit line read active region. The bit line read and write active regions are each discrete regions of the substrate laterally offset from one another. The memory cell is configured to perform a program operation such that FN tunneling occurs between the floating gate and the bit line write active region. Further, the memory cell is configured to perform a read operation such that a data state of the memory cell may be accessed at the second selector transistor and within the bit line read active region. Thus, the FN tunneling utilized in the program operation is isolated from the bit line read active region such that the gate dielectric structure between the floating gate and the bit line read active region is not damaged during the program operation. This in part mitigates and/or eliminates damage to the gate dielectric structure that is adjacent to the bit line read active region, thereby increasing a number of program and/or erase operations that may be performed on the memory cell, decreasing inaccurate read operations, and/or increasing an endurance of the memory cell.

Figure 1B:
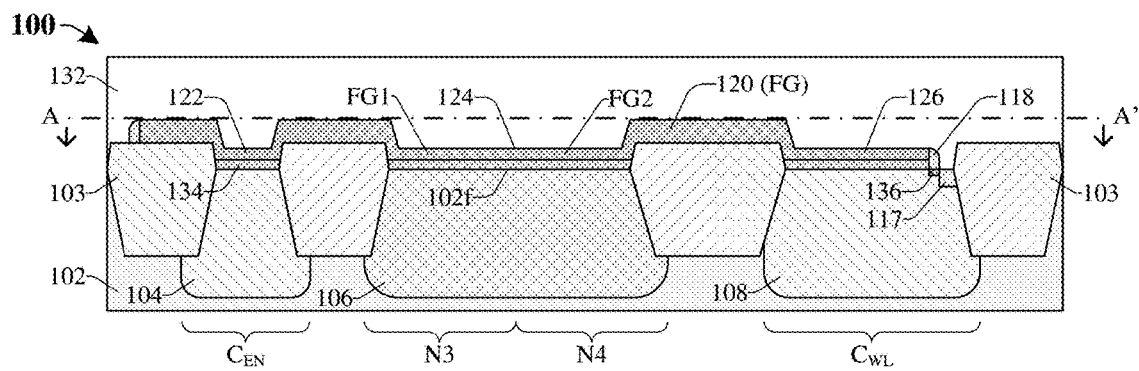
Figure 1C:
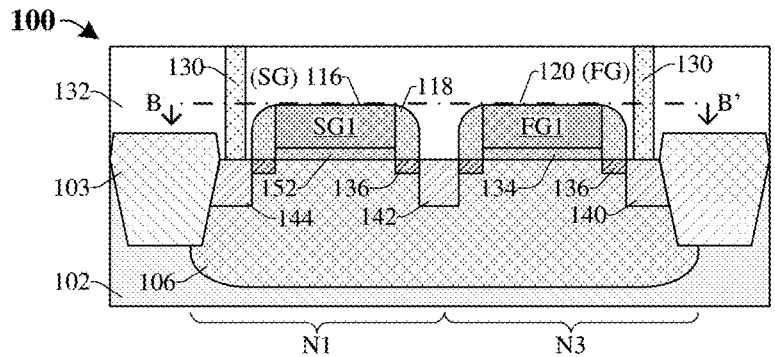

FIGS. 1A-1C illustrate various views of some embodiments of a memory cell 100 comprising a floating gate (FG) 120 overlying a bit line write ($BL_W$) region 112 and a bit line read ($BL_R$) region 114. FIG. 1A illustrates some embodiments of a layout view of the memory cell 100 from a front-side 102f of a substrate 102. FIG. 1B illustrates various embodiments of a cross-sectional view taken along line A-A' of FIG. 1A. FIG. 1C illustrates alternative embodiments of a cross-sectional view taken along line B-B' of FIG. 1A.

The memory cell 100 may include a plurality of transistors N1-N4 and a plurality of capacitors $C_{EN}$, $C_{WL}$. In some embodiments, the memory cell 100 may be in a four-transistor and two-capacitor (4T2C) configuration. In further embodiments, the memory cell 100 includes conductive features overlying the front-side 102f of the substrate 102 and doped regions disposed within the substrate 102. In some embodiments, the conductive features include the FG 120 and a select gate (SG) 116. The FG 120 and the SG 116 overlie the front-side 102f of the substrate 102. The FG 120 is separated from the front-side 102f of the substrate 102 by a dielectric structure 134 and the SG 116 is separated from the front-side 102f of the substrate 102 by a select gate dielectric structure 152. Further, a sidewall spacer structure 118 laterally surrounds sidewalls of the FG 120 and the SG 116, respectively. An isolation structure 103 extends from the front-side 102f of the substrate 102 to a point below the front-side 102f. In further embodiments, an interconnect dielectric structure 132 overlies the FG 120, the SG 116, and the front-side 102f of the substrate 102. In some embodiments, the doped regions include a first well region 104, a second well region 106, and a third well region 108. The FG 120 continuously laterally extends over the first well region 104, the second well region 106, and the third well region 108. In some embodiments, the FG 120 includes a first FG portion 122 overlying the first well region 104, a second FG portion 124 overlying the second well region 106, and a third FG portion 126 overlying the third well region 108. The SG 116 overlies the second well region 106. In some embodiments, the SG 116 and the FG 120 may, for example, each be or comprise a conductive material, such as polysilicon, or another suitable conductive material.

In some embodiments, the first, second, and third well regions 104, 106, 108 are laterally offset from one another by a non-zero distance and/or are discrete from one another. In some embodiments, the substrate 102 may, for example, be or comprise a bulk semiconductor substrate (e.g., a bulk silicon substrate), a silicon-on-insulator (SOI) substrate, or another suitable substrate material and/or may comprise a first doping type (e.g., p-type). In some embodiments, the first well region 104 is a discrete region of the substrate 102 and comprises a second doping type (e.g., n-type) opposite the first doping type. In some embodiments, the first doping type is p-type and the second doping type is n-type, or vice versa. In further embodiments, the second well region 106 is a discrete region of the substrate 102 and comprises the first doping type (e.g., p-type) with a higher doping concentration than the substrate 102. In yet further embodiments, the third well region 108 is a discrete region of the substrate 102 and comprises the second doping type (e.g., n-type).

A first capacitor active region 110 is disposed within the first well region 104 and may comprise the second doping type (e.g., n-type). Thus, in some embodiments, the first capacitor active region 110 comprises a same doping type as the first well region 104. This facilitates the first capacitor active region 110 and the first well region 104 being configured as a first electrode of a first capacitor $C_{EN}$. In further embodiments, the first FG portion 122 of the FG 120 overlying the first capacitor active region 110 and/or the first well region 104 is configured as a second electrode of the first capacitor $C_{EN}$. Thus, a region in which the first FG portion 122 overlaps the first capacitor active region 110 and/or the first well region 104 determines a capacitance of the first capacitor $C_{EN}$. Further, a region of the dielectric structure 134 disposed between the first FG portion 122 and the first capacitor active region 110 and/or the first well region 104 may be configured as a first capacitor dielectric layer of the first capacitor $C_{EN}$. The first capacitor active region 110 may include contact regions 110a, 110b disposed on opposite sides of the first FG portion 122. In some embodiments, a conductive via 130 is disposed over the contact region 110a of the first capacitor active region 110 and is electrically coupled to an erase node (EN). In some embodiments, the EN may be electrically coupled to an erase line configured to perform an erase operation on the memory cell 100.

In some embodiments, the bit line write region 112 and the bit line read region 114 are both disposed within the second well region 106 and are laterally offset from one another by a non-zero distance. In some embodiments, the bit line write and read regions 112, 114 respectively comprise the second doping type (e.g., n-type), such that the bit line write and read regions 112, 114 comprise a doping type opposite the second well region 106. Thus, in some embodiments, depletion regions may respectively from around the bit line write and read regions 112, 114, thereby facilitating electrical isolation between the bit line write and read regions 112, 114. The second well region 106, the bit line write region 112, and the SG 116 are configured to form a first select transistor N1. The second well region 106, the bit line read region 114, and the SG 116 are configured to form a second select transistor N2. The second well region 106, the bit line write region 112, and the second FG portion 124 are configured to form a first storage transistor N3. The second well region 106, the bit line read region 114, and the second FG portion 124 are configured to form a second storage transistor N4. In some embodiments, the transistor N1-N4 may respectively, for example, be or comprise a metal oxide semiconductor field effect transistor (MOS-FET), a high voltage transistor, a bipolar junction transistor (BJT), an n-channel metal oxide semiconductor (nMOS) transistor, a p-channel metal oxide semiconductor (pMOS) transistor, or another suitable transistor. In some embodiments, the transistors N1-N4 are each configured as an nMOS transistor. In further embodiments, the transistors N1-N4 are each configured as a pMOS transistor.

The second FG portion 124 of the FG 120 divides the bit line write region 112 into a first source/drain region 140 and a second source/drain region 142. In some embodiments, a segment of the second FG portion 124 disposed between the first and second source/drain regions 140, 142 is configured as a first floating gate (FG1) of the first storage transistor N3. The SG 116 is disposed laterally between the second source/drain region 142 and a third source/drain region 144 of the bit line write region 112. A segment of the SG 116 disposed between the second source/drain region 142 and the third source/drain region 144 is configured as a first select gate (SG1) of the first select transistor N1. The second FG portion 124 of the FG 120 divides the bit line read region 114 into a fourth source/drain region 146 and a fifth source/drain region 148. In some embodiments, a segment of the second FG portion 124 disposed between the fourth and fifth source/drain regions 146, 148 is configured as a second floating gate (FG2) of the second storage transistor N4. The SG 116 is disposed laterally between the fifth source/drain region 148 and a sixth source/drain region 150 of the bit line read region 114. A segment of the SG 116 disposed between the fifth and sixth source/drain regions 148, 150 is configured as a second select gate (SG2) of the second select transistor N2. In some embodiments, the source/drain regions 140-150 may, for example, respectively be configured as a source or a drain region for a corresponding transistor. In further embodiments, the second source/drain region 142 is configured as a first common source/drain region shared by the first select transistor N1 and the first storage transistor N3, such that the first select transistor N1 and the first storage transistor N3 are serially coupled. In yet further embodiments, the fifth source/drain region 148 is configured as a second common source/drain region shared by the second select transistor N2 and the second storage transistor N4, such that the second select transistor N2 and the second storage transistor N4 are serially coupled.

In some embodiments, a selector line is electrically coupled to the SG 116 by way of an overlying conductive via 130. The selector line may be configured to apply appropriate bias conditions to the SG 116 during an erase operation, a program operation, and/or a read operation performed on the memory cell 100. In further embodiments, a source line (SL) is electrically coupled to the third and/or sixth source/drain regions 144, 150 by way of conductive vias 130 and/or a conductive wire (not shown). Thus, the third and sixth source/drain regions 144, 150 may be electrically coupled together. The SL may be configured to apply appropriate bias conditions to source/drain regions of the first and second select transistors N1, N2 during an erase operation, a program operation, and/or a read operation performed on the memory cell 100.

In some embodiments, a first bit line (BL1) is electrically coupled to the first source/drain region 140 of the first storage transistor N3 by way of a conductive via 130. In some embodiments, the BL1 may be electrically coupled to support circuitry (e.g., a bit line decoder, a word line decoder, a control unit such as a micro controller unit (MCU), etc.) (not shown) such as a bit line decoder (not shown) configured to perform a write operation (i.e., a program operation) on the memory cell 100. In further embodiments, a second bit line (BL2) is electrically coupled to the fourth source/drain region 146 of the second storage transistor N3 by way of a conductive via 130. In some embodiments, the BL2 may be electrically coupled to the support circuitry such as a bit line decoder configured to perform a read operation on the memory cell 100. In some embodiments, a width Ww of the bit line write region 112 is less than a width Wr of the bit line read region 114. In further embodiments, the width Ww of the bit line write region 112 is equal to the width Wr of the bit line read region 114 (not shown).

In some embodiments, a second capacitor active region 117 is disposed within the third well region 108 and may comprise the second doping type (e.g., n-type). Thus, in some embodiments, the second capacitor active region 117 comprises a same doping type as the third well region 108. This facilitates the second capacitor active region 117 and the third well region 108 being configured as a first electrode of a second capacitor $C_{WL}$. In some embodiments, the third FG portion 126 of the FG 120 overlying the second capacitor active region 117 and/or the third well region 108 is configured as a second electrode of the second capacitor $C_{WL}$. Thus, a region in which the third FG portion 126 overlaps the second capacitor active region 117 and/or the third well region 108 determines a capacitance of the second capacitor $C_{WL}$. Further, a region of the dielectric structure 134 disposed between the third FG portion 126 and the second capacitor active region 117 and/or the third well region 108 may be configured as a second capacitor dielectric layer of the second capacitor $C_{WL}$. In some embodiments, one or more conductive vias 130 overlie the second capacitor active region 117 and may be electrically coupled to a word line (WL). In some embodiments, the WL may be electrically coupled to support circuitry, such as a word line decoder (not shown) that is configured to perform a read and/or write operation on the memory cell 100. In some embodiments, an area of the first FG portion 122 over the first capacitor active region 110 is less than an area of the third FG portion 126 over the second capacitor active region 117, such that the capacitance of the first capacitor $C_{EN}$ is less than the capacitance of the second capacitor $C_{WL}$.

In some embodiments, lightly doped regions 136 are disposed within the substrate 102 and may be disposed between the FG 120 and/or the SG 116 and an adjacent active region (e.g., the second capacitor active region 117, the bit line write and/or read regions 112, 114). In various embodiments, the lightly doped region 136 comprises a same doping type as the adjacent active region (e.g., the second doping type). In yet further embodiments, the lightly doped region 136 may have a lower doping concentration than the adjacent active region (e.g., the second capacitor active region 117). In some embodiments, the lightly doped region 136 may be a part of an adjacent source/drain region.

In some embodiments, during a programing operation performed on the memory cell 100, charge carriers (e.g., electrons) may be injected from the first source/drain region 140 of the bit line write region 112 to the FG 120 by Fowler-Nordheim (FN) tunneling. In such embodiments, the programing operation may damage a segment of the dielectric structure 134 disposed between the first floating gate FG1 and the second well region 106 and/or the bit line write region 112. In further embodiments, during a read operation performed on the memory cell 100, a data state of the memory cell 100 may be accessed at the sixth source/drain region 150 of the bit line read region 114 by way of the second storage transistor N4 and the second select transistor N2. In such embodiments, because the bit line write region 112 and the bit line read region 114 are laterally offset from one another by a non-zero distance, the damage to the dielectric structure 134 by the programing operation may not adversely affect the read operation performed on the memory cell 100. For example, a segment of the dielectric structure 134 disposed between the second floating gate FG2 and the second well region 106 and/or the bit line read region 114 may not be damaged by the programing operation. This in turn may mitigate inaccurate read operations, increase a number of write operations (i.e., erase and/or program operations) that may be performed on the memory cell 100, and/or increase a reliability of the memory cell 100.

Figure 2:
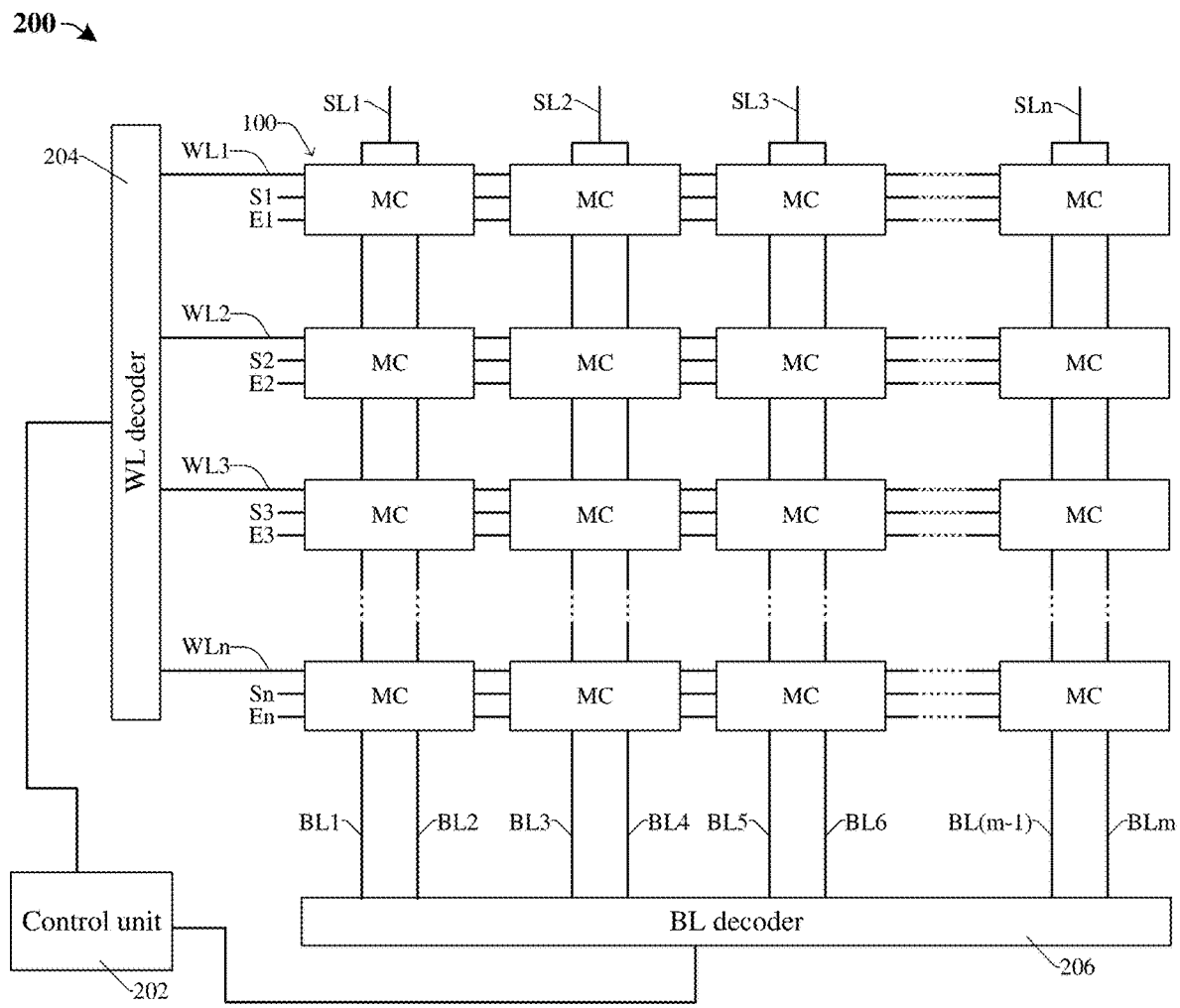
FIG. 2 illustrates a block diagram of some embodiments of a circuit comprising a plurality of rows and columns of memory cells (MCs).

FIG. 2 illustrates a block diagram of some embodiments of a circuit 200 comprising a plurality of rows and columns of memory cells (MCs).

The circuit 200 includes a plurality of MCs, a plurality of bit lines BL1-$m$ (m is an integer), a plurality of source lines SL1-$n$ (n is an integer), a plurality of word lines WL1-$n$, a plurality of selector lines S1-$n$, a plurality of erase lines E1-$n$, a control unit 202, a word line (WL) decoder 204, and a bit line (BL) decoder 206. In some embodiments, the MCs may respectively be configured as the memory cell 100 of FIGS. 1A-1C, such that each MC has a bit line write region (112 of FIG. 1A) laterally offset from a bit line read region (114 of FIG. 1A) and are each in a 4T2C configuration. The MCs are arranged within a memory array comprising rows and columns. MCs within a row of the memory array are operably coupled to a word line WL1-$n$ while MCs within a column of the memory array are operably coupled to one or more bit lines BL1-$m$. This causes the plurality of MCs to be respectively associated with an address defined by an intersection of a WL and one or more BLs. In some embodiments, each of the MCs may be configured as a non-volatile memory (NVM) multi-time programmable (MTP) cell, such that a resistance value of each MC may be set and/or reset between at least two resistance values. In further embodiments, a resistance value of each NVM MTP cell may be set and/or reset multiple times (e.g., greater than 10,000 set and/or reset operations may be performed on each cell).

The memory array is electrically coupled to support circuitry that is configured to perform a write operation (i.e., an erase operation and/or a program operation) and/or a read operation on the plurality of MCs. In some embodiments, the support circuitry includes the control unit 202, the WL decoder 204, and the BL decoder 206. In further embodiments, the control unit 202 is a microprocessor circuit. In yet further embodiments, the plurality of selector lines S1-$n$ and/or the plurality of erase lines E1-$n$ may be electrically coupled to the control unit 202 and/or the WL decoder 204. The control unit 202 is configured to control the WL decoder 204 and/or the BL decoder 206, for example, the control unit 202 may supply an address (e.g., the address is associated with a single MC in the memory array) to the WL decoder 204 and/or the BL decoder 206. In some embodiments, the WL decoder 204 is configured to selectively apply a signal (e.g., a current and/or a voltage) to one or more of the word lines WL1-$n$, one or more of the erase lines E1-$n$, and/or one or more of the selector lines S1-$n$ based upon the received address. The BL decoder 206 is configured to selectively apply a signal (e.g., a current and/or a voltage) to one or more of the bit lines BL1-$m$ based upon the received address. In some embodiments, the plurality of source lines SL1-$n$ are electrically coupled to support read circuitry (not shown) such as a multiplexer and/or an amplifier configured to determine an output of a read operation.

In some embodiments, each MC is directly electrically coupled to at least two bit lines BL1-$m$. For example, a first bit line BL1 and a second bit line BL2 are electrically coupled to the memory cell 100. In various embodiments, the first bit line BL1 is directly electrically coupled to a bit line write region (e.g., 112 of FIG. 1A) and the second bit line BL2 is directly electrically coupled to a bit line read region (e.g., 114 of FIG. 1A). In such embodiments, the first BL1 and/or the bit line write region (e.g., 112 of FIG. 1A) may be utilized during a write operation (e.g., erase or program operation) to set a resistance value of the memory cell 100, such that FN tunneling occurs in the bit line write region (e.g., 112 of FIG. 1A). During the write operation, an unselect bias voltage may be applied to the second bit line BL2, such that the bit line read region (e.g., 114 of FIG. 1A) is unselected. Further, during a read operation performed on the memory cell 100, an unselect bias voltage is applied to the first bit line BL1, such that the bit line write region (e.g., 112 of FIG. 1A) is unselected. Thus, FN tunneling may not occur in the bit line read region (e.g., 114 of FIG. 1A) during the write operation, thereby increasing an endurance and reliability of the memory cell 100.

Figures 3, 4:
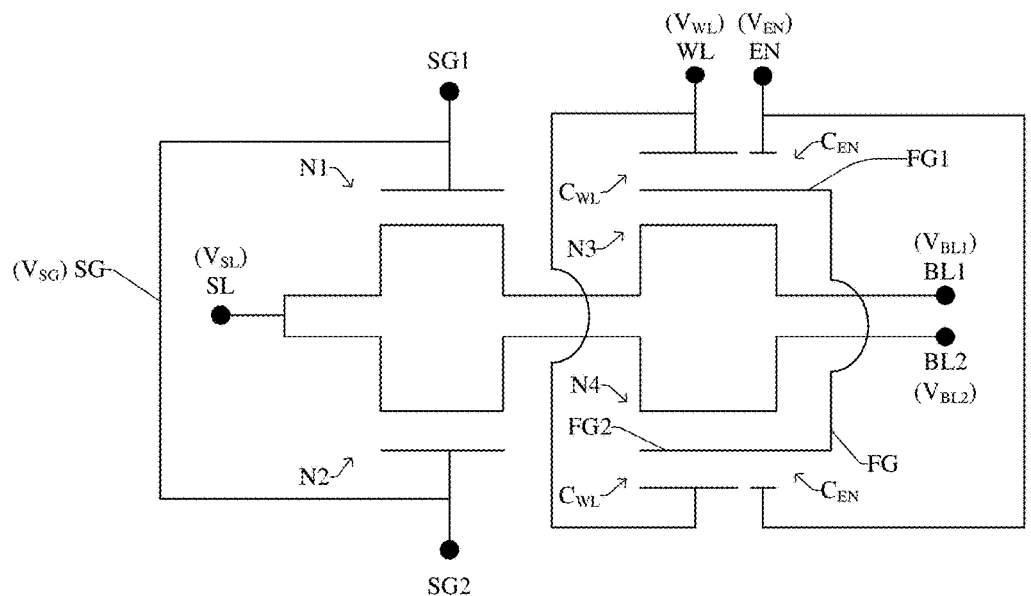
FIG. 3 illustrates a circuit diagram of some embodiments of the memory cell of FIGS. 1A-1C.
FIG. 4 illustrates a table corresponding to some embodiments of some operation conditions of the memory cell of FIGS. 1A-1C.

FIG. 3 illustrates a circuit diagram 300 of some embodiments of the memory cell 100 of FIGS. 1A-1C. FIG. 4 illustrates a table 400 corresponding to some embodiments of some operation conditions of the memory cell 100 of FIGS. 1A-1C.

As illustrated in FIG. 3, a select gate SG includes a first select gate SG1 and a second select gate SG2 directly electrically coupled to one another. A select gate voltage VSG may be applied to the select gate SG. A first select transistor N1 includes the first select gate SG1 and a second select transistor N2 includes the second select gate SG2. A first select source/drain region of the first select transistor N1 and a first select source/drain region of the second select transistor N2 are both electrically coupled to a source line SL. A source line voltage $V_{SL}$ may be applied to the source line SL. A first storage source/drain region of a first storage transistor N3 is directly electrically coupled to a second select source/drain region of the first select transistor N1. A first storage source/drain region of a second storage transistor N4 is directly electrically coupled to a second select source/drain region of the second select transistor N2. In some embodiments, a floating gate FG includes a first floating gate FG1 and a second floating gate FG2. The first storage transistor N3 includes the first floating gate FG1 and the second storage transistor N4 includes the second floating gate FG2. A second storage source/drain region of the first storage transistor N3 is directly electrically coupled to a first bit line BL1 and a second storage source/drain region of the second storage transistor N4 is directly electrically coupled to a second bit line BL2. A first bit line voltage $V_{BL1}$ may be applied to the first bit line BL1 and a second bit line voltage $V_{BL2}$ may be applied to the second bit line BL2.

A first capacitor $C_{EN}$ is disposed between the floating gate FG and an erase node (EN). In some embodiments, a first electrode of the first capacitor $C_{EN}$ may be defined by first doped regions of a substrate (e.g., a first capacitor active region (110 of FIG. 1A) and/or a first well region (104 of FIG. 1A)) and a second electrode of the first capacitor $C_{EN}$ may be defined by the floating gate FG. In some embodiments, the first capacitor $C_{EN}$ may, for example, be configured as a tunneling capacitor. An erase node voltage $V_{EN}$ may be applied to the first electrode of the first capacitor $C_{EN}$. In some embodiments, the erase node voltage $V_{EN}$ may be applied to the first capacitor active region (110 of FIG. 1A). In further embodiments, the erase node voltage $V_{EN}$ may be directly applied to the first well region (104 of FIG. 1A). In various embodiments, the erase node voltage $V_{EN}$ may, for example, be applied to the first electrode of the first capacitor $C_{EN}$ by way of an erase line EL. A second capacitor $C_{WL}$ is disposed between the floating gate FG and a word line WL. In some embodiments, a first electrode of the second capacitor $C_{WL}$ may be defined by second doped regions of a substrate (e.g., a second capacitor active region (117 of FIG. 1A) and/or a third well region (108 of FIG. 1A)) and a second electrode of the second capacitor $C_{WL}$ may be defined by the floating gate FG. In some embodiments, the second capacitor $C_{WL}$ may, for example, be configured has a coupling capacitor. A word line voltage $V_{WL}$ may be applied to the first electrode of the second capacitor $C_{WL}$. In some embodiments, the word line voltage $V_{WL}$ may be directly applied to the third well region (108 of FIG. 1A). In further embodiments, the word line voltage $V_{WL}$ may be directly applied to the second capacitor active region (117 of FIG. 1A). In various embodiments, the word line voltage $V_{WL}$ may, for example, be applied to the first electrode of the second capacitor $C_{WL}$ by way of a word line WL.

Table 400 of FIG. 4 illustrates some embodiments of various operating conditions of the circuit diagram of FIG. 3. In some embodiments, during an erase operation, the select gate voltage VSG applied to the select gate SG is about 0 volts (V). The word line voltage $V_{WL}$ is, for example, about 0 V and may be applied to the third well region (108 of FIG. 1A). The erase node voltage $V_{EN}$ is, for example, a high voltage (HV) and may be applied to the first well region (104 of FIG. 1A). In some embodiments, the HV may, for example, be within a range of about 7 to 10 V, within a range of about 11 to 18 V, within a range of about 7 to 18 V, or another suitable value. The first bit line voltage $V_{BL1}$ is, for example, about 0 V and may be applied to the second storage source/drain region of the first storage transistor N3 (e.g., the first source/drain region 140 of FIG. 1A). The second bit line voltage $V_{BL2}$ is, for example, about 0 V and may be applied to the second storage source/drain region of the second storage transistor N4 (e.g., the fourth source/drain region 146 of FIG. 1A). The source line voltage $V_{SL}$ is about 0 V and may be applied to the first select source/drain region of the first and second select transistors N1, N2 (e.g., the third and sixth source/drain regions 144, 150 of FIG. 1A). In some embodiments, a bulk substrate voltage $V_{BULK}$ is about 0 V and may be applied to a bulk region of the substrate (102 of FIGS. 1A-1C). In further embodiments, the bulk region of the substrate (102 of FIGS. 1A-1C) may be region(s) of the substrate (102 of FIGS. 1A-1C) that is/are offset from the first, second, and third well regions (104, 106, 108 of FIG. 1A). Under the aforementioned operating conditions, a voltage at the first capacitor $C_{EN}$ is sufficiently high such that charge carriers (e.g., electrons) are discharged from the floating gate FG by FN tunneling to the first electrode of the first capacitor $C_{EN}$ (e.g., the first well region (104 of FIG. 1A) and/or the first capacitor active region (110 of FIG. 1A)). This in part erases a data state of the floating gate FG such that the floating gate FG is in a high resistance state. By virtue of utilizing FN tunneling to erase the floating gate FG, a power consumption of the circuit 300 may be reduced.

In some embodiments, the circuit diagram 300 of FIG. 3 is disposed in an array of memory cells. In such embodiments, the circuit diagram 300 represents a single memory cell (e.g., memory cell 100 of FIG. 2), during the erase operation a first unselect bit line voltage is applied to a second storage source/drain of a first storage transistor of the one or more unselected memory cells (MCs) and a second unselect bit line voltage is applied to a second storage source/drain region of a second storage transistor of the one or more unselected MCs. In various embodiments, during the erase operation, the first unselect bit line voltage may be about 0 V and the second unselect bit line voltage may be about 0 V. For example, in FIG. 2, an unselect bit line voltage applied to the bit lines BL3-$m$ may each be about 0 V, such the MCs coupled to the bit lines BL3-$m$ may not be erased by the erase operation performed on the memory cell 100.

In further embodiments, during a program operation, the select gate voltage VSG is about 0 V and may be applied to the select gate SG. The word line voltage $V_{WL}$ is, for example, a high voltage (HV) and may be applied to the third well region (108 of FIG. 1A). In some embodiments, the HV may, for example, be within a range of about 7 to 10 V, within a range of about 11 to 18 V, within a range of about 7 to 18 V, or another suitable value. The erase node voltage $V_{EN}$ is, for example, the HV and may be applied to the first well region (104 of FIG. 1A). The first bit line voltage $V_{BL1}$ is, for example, about 0 V and may be applied to the second storage source/drain region of the first storage transistor N3 (e.g., the first source/drain region 140 of FIG. 1A). The second bit line voltage $V_{BL2}$ is, for example, about half of the HV (e.g., about HV/2) and may be applied to the second storage source/drain region of the second storage transistor N4 (e.g., the fourth source/drain region 146 of FIG. 1A). The source line voltage $V_{SL}$ is about 0 V and may be applied to the first select source/drain region of the first and second select transistors N1, N2 (e.g., the third and sixth source/drain regions 144, 150 of FIG. 1A). In some embodiments, a bulk substrate voltage $V_{BULK}$ is about 0 V and may be applied to a bulk region of the substrate (102 of FIGS. 1A-1C). Under the aforementioned operation conditions, by virtue of the HV being applied to the first and second capacitors $C_{EN}$, $C_{WL}$ and about 0 V being applied to the first bit line BL1, an inverse of the erase operation occurs, such that charge carriers (e.g., electrons) are injected from the second storage source/drain region of the first storage transistor N3 by FN tunneling into the floating gate FG. In some embodiments, the charge carriers may be injected from the bit line write region (112 of FIG. 1A) and/or the second well region (106 of FIG. 1A). This in part programs a data state of the floating gate FG such that the floating gate FG is in a low resistance state. By virtue of utilizing FN tunneling to program the floating gate FG, a power consumption and a programming time (e.g., a write time) of the circuit 300 may be reduced. In further embodiments, if, for example, channel hot electrode (CHE) injection (not shown) is utilized to program the floating gate FG, a power consumption and programming time may be increased.

In further embodiments, by virtue of applying about half of the HV (e.g., about HV/2) to the second storage source/drain region of the second storage transistor N4 (e.g., the fourth source/drain region 146 of FIG. 1A) during the program operation, the second storage transistor N4 may be unselected during the program operation. This in turn eliminates and/or mitigates an injection of charge carriers from the second storage source/drain region of the second storage transistor N4 into the floating gate FG. Thus, a segment of the dielectric structure (134 of FIGS. 1B-1C) underlying the second floating gate FG2 may not be damaged by the FN tunneling. This increases a number of erase, write, and/or read operations that may be performed on the floating gate FG, thereby increasing a reliability and endurance of the circuit 300.

In further embodiments, when the circuit diagram 300 of FIG. 3 is disposed within an array of MCs, an unselect bit line voltage may be applied to one or more unselected MCs. The unselect bit line voltage may, for example, be about half of the HV (e.g., about HV/2), such that the one or more unselected MCs are not programed. For example, in FIG. 2 and during the program operation, the unselect bit line voltage may be applied to the bit lines BL3-m.

In yet further embodiments, during a read operation, the select gate voltage VSG is about 5 V and may be applied to the select gate SG. In some embodiments, the select gate voltage VSG may, for example, be about 2.5 V, 3.3 V, or another suitable voltage such that the first and/or second select transistors N1, N2 are each in an ON state. The word line voltage $V_{WL}$ is, for example, about 1.5 V and may be applied to the third well region (108 of FIG. 1A). The erase node voltage $V_{EN}$ is, for example, about 0 V and may be applied to the first well region (104 of FIG. 1A). The first bit line voltage $V_{BL1}$ is, for example, about 0 V and may be applied to the second storage source/drain region of the first storage transistor N3 (e.g., the first source/drain region 140 of FIG. 1A). The second bit line voltage $V_{BL2}$ is, for example, about 1.2 V and may be applied to the second storage source/drain region of the second storage transistor N4 (e.g., the fourth source/drain region 146 of FIG. 1A). In some embodiments, a bulk substrate voltage $V_{BULK}$ is about 0 V and may be applied to a bulk region of the substrate (102 of FIGS. 1A-1C). Under the aforementioned operation conditions, a data state of the FG floating gate may be read at the source line SL. Because the second bit line voltage $V_{BL2}$ is significantly less than a voltage applied for a program operation (e.g., the HV) damage to the segment of the dielectric structure (134 of FIGS. 1B-1C) underlying the second floating gate FG2 is eliminated and/or reduced during the read operation. By virtue of the bit line write region (112 of FIG. 1A) being laterally offset from the bit line read region (114 of FIG. 1A), the read operation may not be affected by the FN tunneling utilized during the program operation. This in turn reduces and/or eliminates a number of inaccurate read operations and increases a reliability and endurance of the circuit 300. In further embodiments, an unselect bit line voltage applied to one or more unselected MCs may be about 0 V, for example, in FIG. 2, the unselected bit line voltage may be applied to the bit lines BL3-m.

Figures 5, 6:
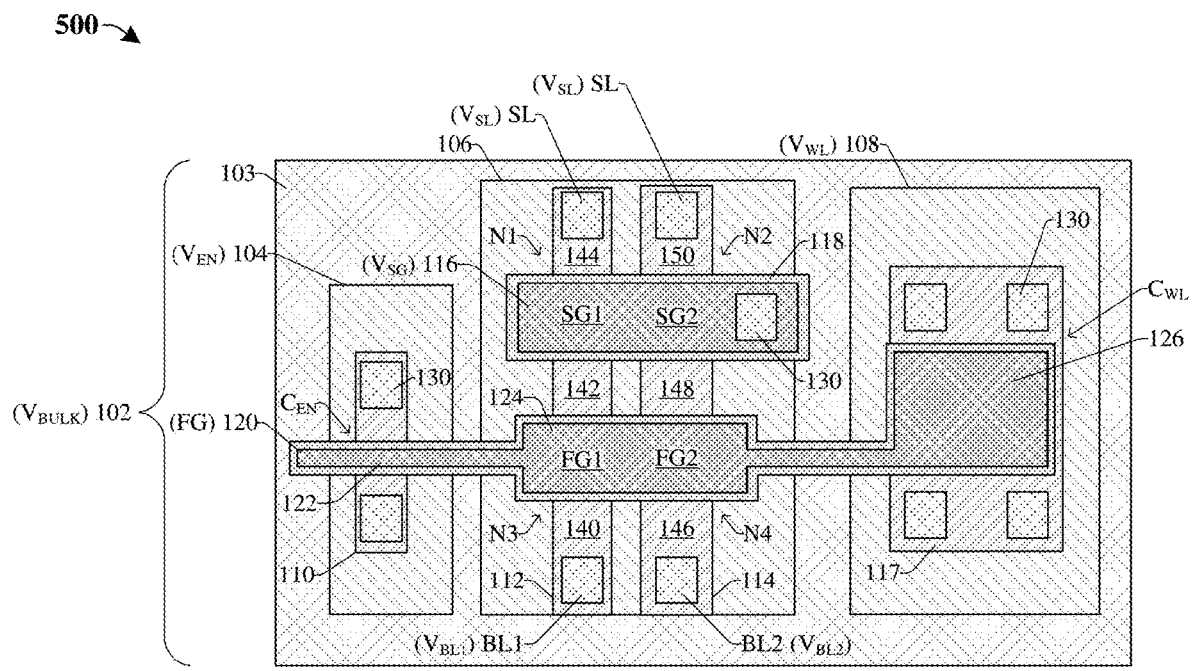
FIG. 5 illustrates a layout view of some embodiments of a memory cell including a plurality of p-channel metal oxide semiconductor (pMOS) transistors according to some alternative embodiments of the memory cell of FIGS. 1A-1C.
FIG. 6 illustrates a table corresponding to some embodiments of some operation conditions of the memory cell of FIG. 5.

FIG. 5 illustrates a layout view of some embodiments of a memory cell 500 including a plurality of p-channel metal oxide semiconductor (pMOS) transistors according to some alternative embodiments of the memory cell 100 of FIGS. 1A-1C.

In some embodiments, the first well region 104, the second well region 106, and the third well region 108 respectively comprise the second doping type (e.g., n-type). In further embodiments, the first capacitor active region 110, the second capacitor active region 117, the bit line write region 112, and the bit line read region 114 respectively comprise the first doping type (e.g., p-type) opposite the second doping type. Thus, in some embodiments, the plurality of transistors N1-N4 may respectively be configured as p-channel metal oxide semiconductor (pMOS) transistors.

FIG. 6 illustrates a table 600 corresponding to some embodiments of some operation conditions of the memory cell 500 of FIG. 5.

In some embodiments, the table 600 illustrates various operating conditions of the memory cell 500 of FIG. 5, in which the transistors N1-N4 are configured as pMOS transistors. In some embodiments, the erase operation and the program operation of table 600 may, for example, be the same as the erase operation and the program operation performed on the circuit 300 of FIG. 3 as illustrated and described in table 400 of FIG. 4.

In some embodiments, during a read operation, the select gate voltage VSG is about 0 V, the word line voltage $V_{WL}$ is about 3.5 V, the erase node voltage $V_{EN}$ is about 5 V, the first bit line voltage $V_{BL1}$ is about 5 V, the second bit line voltage $V_{BL2}$ is about 3.8 V, source line voltage $V_{SL}$ is about 5V, and the bulk substrate voltage $V_{BULK}$ is about 5 V. Under the aforementioned operation conditions, a data state of the FG floating gate may be read at the second select transistor N2. In further embodiments, an unselect bit line voltage applied to one or more unselected MCs may be about 5 V, for example, in FIG. 2, the unselected bit line voltage may be applied to the bit lines BL3-m.

FIGS. 7A-11B illustrate a series of various views 700a-1100b of some embodiments of a method for forming a memory cell including a floating gate overlying a first bit line active region and a second bit line active region. Figures with a suffix of "A" illustrate a layout view of the memory cell during various formation processes. Figures with a suffix of "B" are taken along a cut line of a corresponding Figure with the suffix of "A". Although the various views 700a-1100b shown in FIGS. 7A-11B are described with reference to a method, it will be appreciated that the structures shown in FIGS. 7A-11B are not limited to the method but rather may stand alone separate of the method. Although FIGS. 7A-11B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7A:
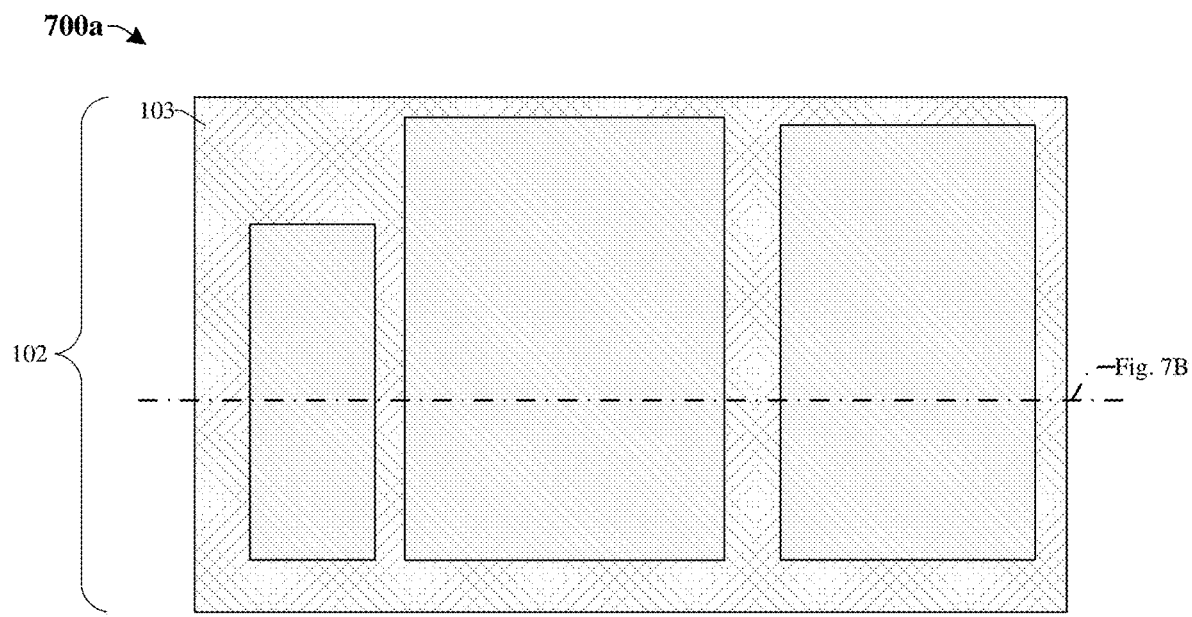
FIGS. 7A-11B illustrate various views of some embodiments for forming a memory cell including a floating gate overlying a first bit line active region and a second bit line active region.
Figure 7B:
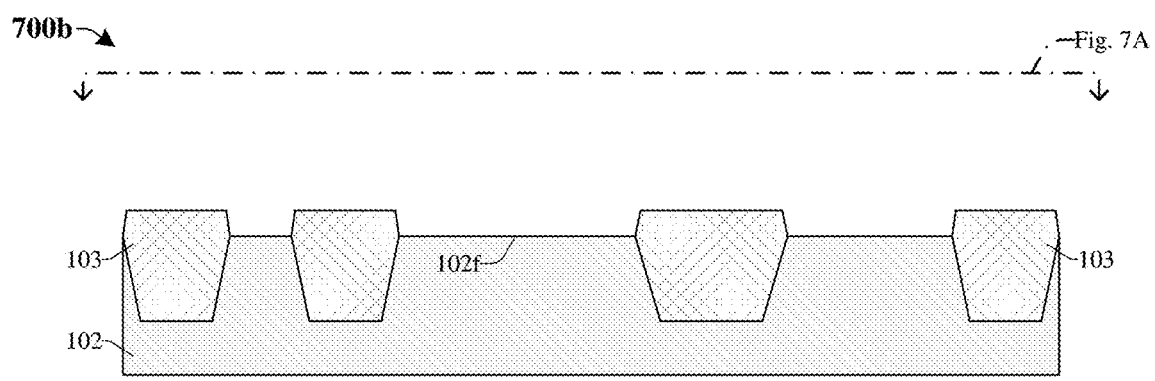

As shown in FIGS. 7A-7B, a substrate 102 is provided and an isolation structure 103 is formed in the substrate 102. In some embodiments, the substrate 102 may, for example, be or comprise a bulk semiconductor substrate (e.g., a bulk silicon substrate), a silicon-on-insulator (SOI) substrate, or another suitable substrate material and/or may comprise a first doping type (e.g., p-type). In some embodiments, the isolation structure 103 may be formed by selectively etching the substrate 102 to form a trench in the substrate 102 that extends into the substrate 102 from a front-side 102f of the substrate 102, and subsequently filling (e.g., by chemical vapor deposition (CVD), physical vapor deposition (PVD), atomic layer deposition (ALD), thermal oxidation, or another suitable deposition or growth process) the trench with a dielectric material. In some embodiments, the dielectric material may, for example, be or comprise silicon dioxide, silicon carbide, silicon nitride, another suitable dielectric material, or a combination of the foregoing. In further embodiments, the substrate 102 may be selectively etched by forming a masking layer (not shown) on the front-side 102f and subsequently exposing the substrate 102 to an etchant configured to selectively remove unmasked portions of the substrate 102. In some embodiments, the isolation structure 103 may, for example, be configured as a shallow trench isolation (STI) structure, a deep trench isolation (DTI) structure, or another suitable isolation structure.

Figure 8A:
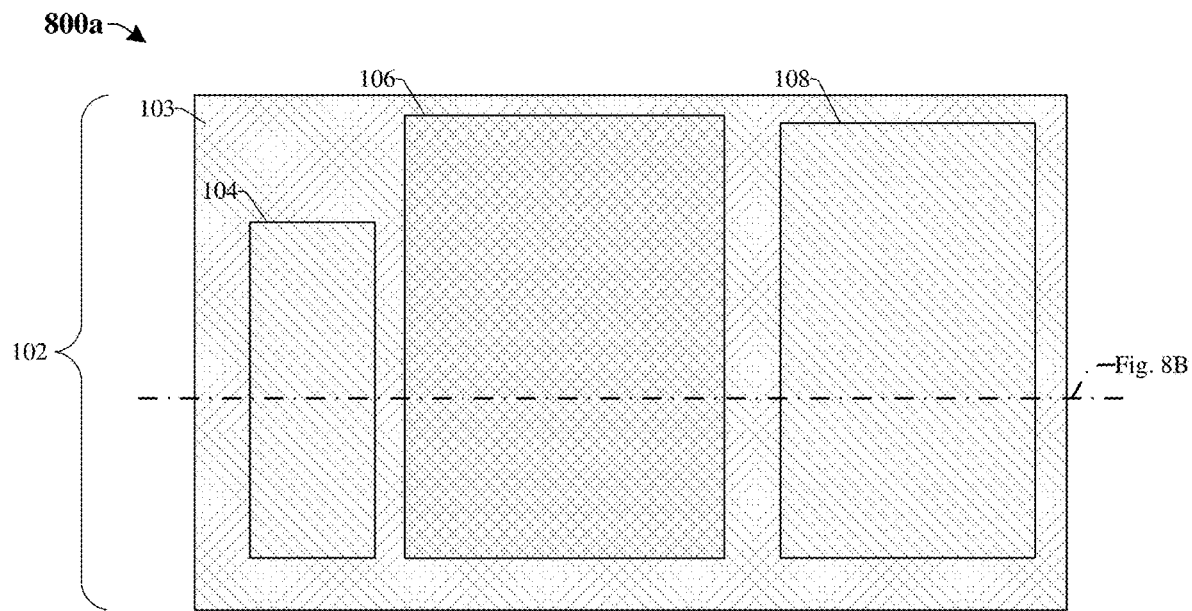
Figure 8B:
Figure 8B:
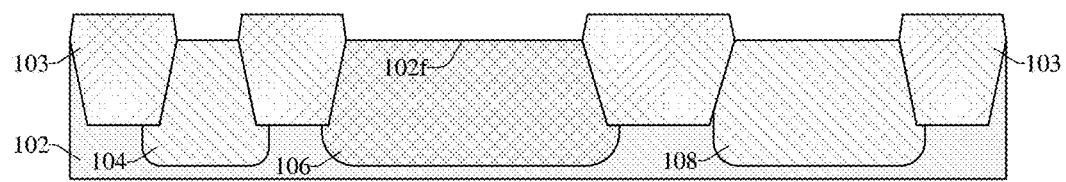

As shown in FIGS. 8A-8B, one or more selective ion implantation processes may be performed to form a first well region 104, a second well region 106, and a third well region 108 in the substrate 102. In some embodiments, the first and third well regions 104, 108 may each be discrete regions of the substrate 102 having a second doping type (e.g., n-type) opposite the first doping type. In some embodiments, the first doping type is p-type and the second doping type is n-type, or vice versa. In further embodiments, the second well region 106 may be a discrete region of the substrate 102 having the first doping type (e.g., p-type) with a doping concentration greater than a doping concentration of the substrate 102. In some embodiments, the one or more selective ion implantation processes may each include: forming a masking layer (not shown) over the front-side 102f of the substrate 102 and selectively implanting ions in the substrate 102 according to the masking layer. In some embodiments, before forming the first, second, and third well regions 104, 106, 108 one or more N-buried layers (NBLs) (not shown) and/or one or more deep N-wells (DNWs) (not shown) may be formed within the substrate 102 such that the NBLs and/or DNWs underlie the first, second, and/or third well regions 104, 106, 108. In further embodiments, after forming the one or more NBLs and/or DNWs, one or more input/output contact regions (not shown) may be formed within the substrate 102. In some embodiments, the one or more input/output contact regions may be doped regions of the substrate 102 configured to facilitate an electrical connection with the substrate 102. In some embodiments, the one or more input/out contact regions may include a bulk substrate contact region configured to facilitate application of a bulk substrate voltage to the substrate 102.

Figure 9A:
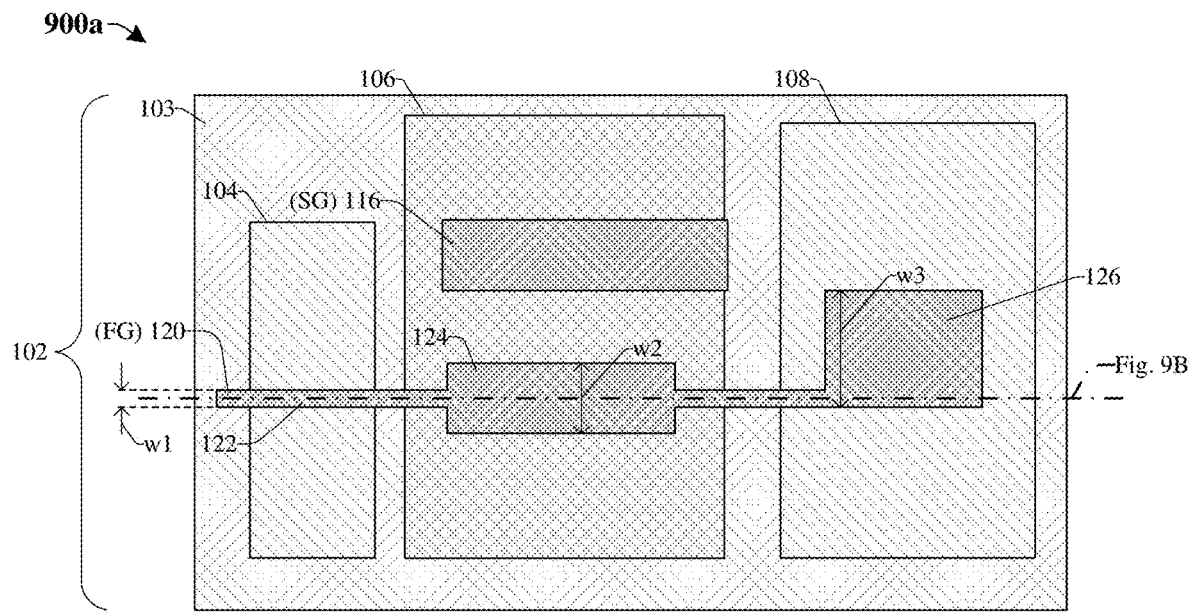
Figure 9B:
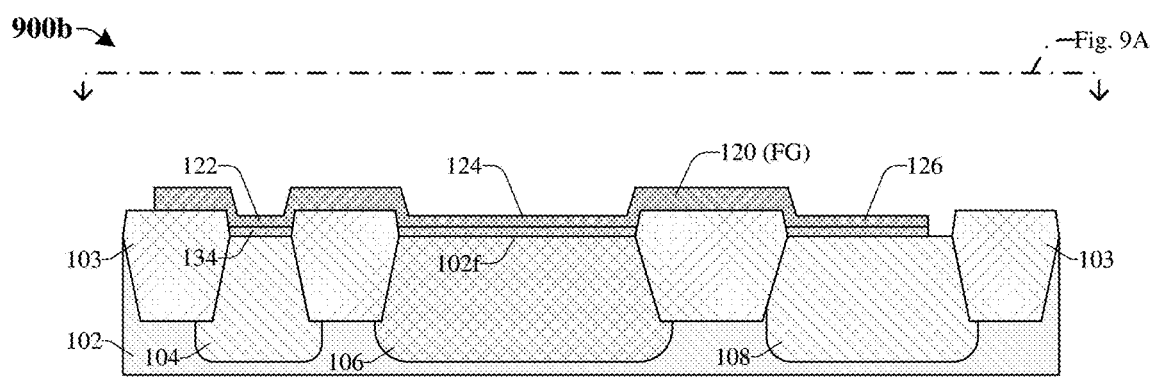

As shown in FIGS. 9A-9B, a dielectric structure 134 and a select gate dielectric structure (152 of FIG. 1C) (not shown) are formed over the front-side 102f of the substrate 102. Further, a floating gate (FG) 120 and a select gate (SG) 116 are respectively formed on the dielectric structure 134 and the select gate dielectric structure (152 of FIG. 1C). In some embodiments, the dielectric structure 134 and/or the select gate dielectric structure (152 of FIG. 1C) may, for example, respectively be deposited by CVD, PVD, ALD, thermal oxidation, or another suitable deposition or growth process. In yet further embodiments, the dielectric structure 134 and/or the select gate dielectric structure (152 of FIG. 1C) may respectively, for example, be or comprise silicon dioxide, a high-k dielectric material, or another suitable dielectric material. Further, the FG 120 may be deposited (e.g., by CVD, PVD, ALD, sputtering, or another suitable growth or deposition process) on the dielectric structure 134 and the SG 116 may be deposited (e.g., by CVD, PVD, ALD, sputtering, or another suitable growth or deposition process) on the select gate dielectric structure (152 of FIG. 1C). Subsequently, the FG 120, the SG 116, the dielectric structure 134, and the select gate dielectric structure (152 of FIG. 1C) may be patterned according to a masking layer (not shown). In yet further embodiments, the FG 120 and/or the SG 116 may, for example, respectively be or comprise polysilicon such as intrinsic polysilicon and/or doped polysilicon, aluminum, another suitable conductive material, or a combination of the foregoing.

Also as illustrated in FIGS. 9A-9B, the FG 120 is a continuous conductive structure that laterally extends from over the first well region 104 to over the third well region 108. In some embodiments, a first FG portion 122 of the FG 120 overlying the first well region 104 may have a width w1 and a second FG portion 124 of the FG 120 overlying the second well region 106 may have a width w2 greater than the width w1 of the first FG portion 122. Further, a third FG portion 126 of the FG 120 may have a width w3 greater than the width w2 of the second FG portion 124.

Figure 10A:
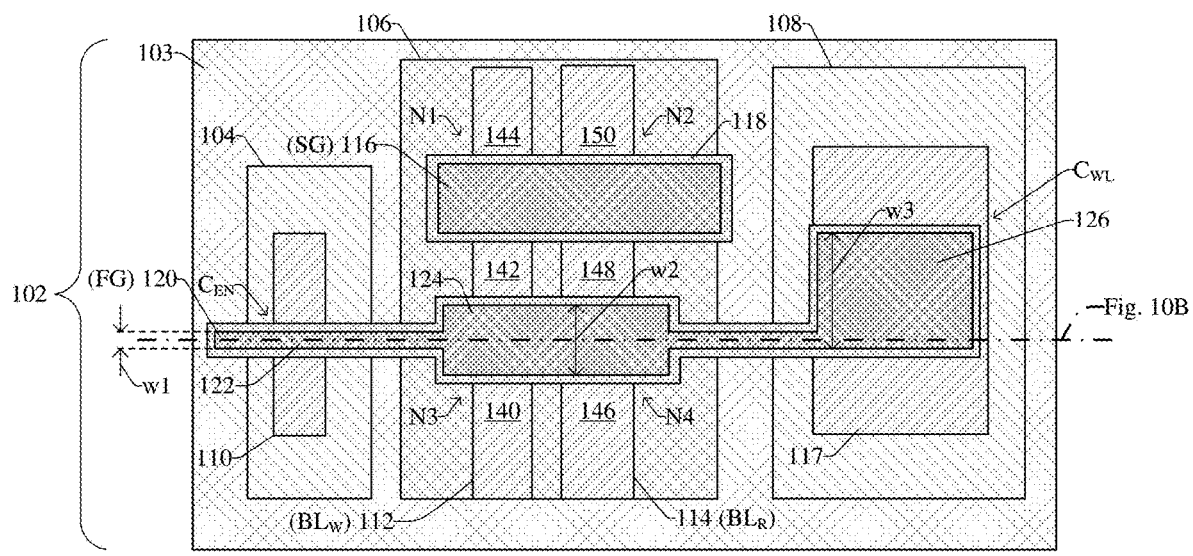
Figure 10B:
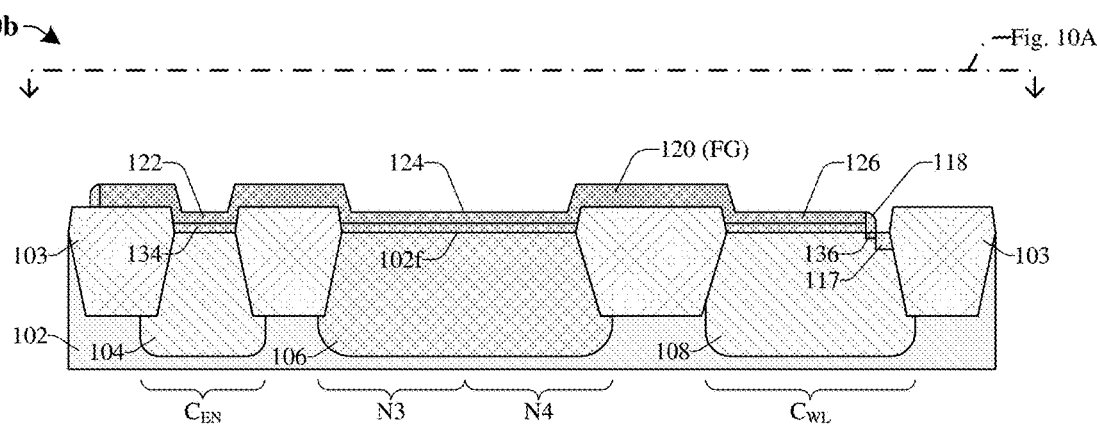

As shown in FIGS. 10A-10B, sidewall spacer structures 118 are formed along sidewalls of the FG 120 and sidewalls of the SG 116. In some embodiments, the sidewall spacer structures 118 may be formed by depositing (e.g., by CVD, PVD, ALD, thermal oxidation, etc.) a spacer material over the substrate 102 and along sidewalls of the FG 120 and the SG 116; and subsequently patterning the spacer material to remove the spacer material from horizontal surfaces, thereby forming the sidewall spacer structures 118. In some embodiments, the sidewall spacer structures 118 may, for example, be or comprise silicon nitride, silicon carbide, or another suitable dielectric material. In some embodiments, before forming the sidewall spacer structures 118, lightly doped regions 136 may be formed within the substrate 102 and may be aligned with one or more sidewalls of the SG 116 and one or more sidewalls of the FG 120. The lightly doped regions 136 may, for example, be formed by selectively implanting ions into the substrate 102 according to a masking layer (not shown). In some embodiments, the lightly doped regions 136 may comprise the second doping type (e.g., n-type).

Further, as shown in FIGS. 10A-10B, a first capacitor active region 110, a bit line write region 112, a bit line read region 114, and a second capacitor active region 117 are formed within the substrate 102. The first capacitor active region 110 is formed on opposing sides of the first FG portion 122 and is formed within the first well region 104. The bit line write region 112 and the bit line read region 114 are respectively formed on opposing sides of the second FG portion 124 and opposing sides of the SG 116 within the second well region 106. The second capacitor active region 117 is formed around sidewalls of the third FG portion 126 within the third well region 108. In some embodiments, the first capacitor active region 110, the bit line write region 112, the bit line read region 114, and the second capacitor active region 117 may each be formed by a selective ion implantation process that utilizes a masking layer (not shown) disposed over the front-side 102f of the substrate 102 to selectively implant dopants into the substrate 102. In further embodiments, the first capacitor active region 110, the bit line write region 112, the bit line read region 114, and the second capacitor active region 117 may each comprise the second doping type (e.g., n-type). This in turn defines a plurality of transistors N1-N4 and a plurality of capacitors $C_{EN}$, $C_{WL}$. In yet further embodiments, the bit line write region 112 is laterally offset from the bit line read region 114 by a non-zero distance.

Figure 11A:
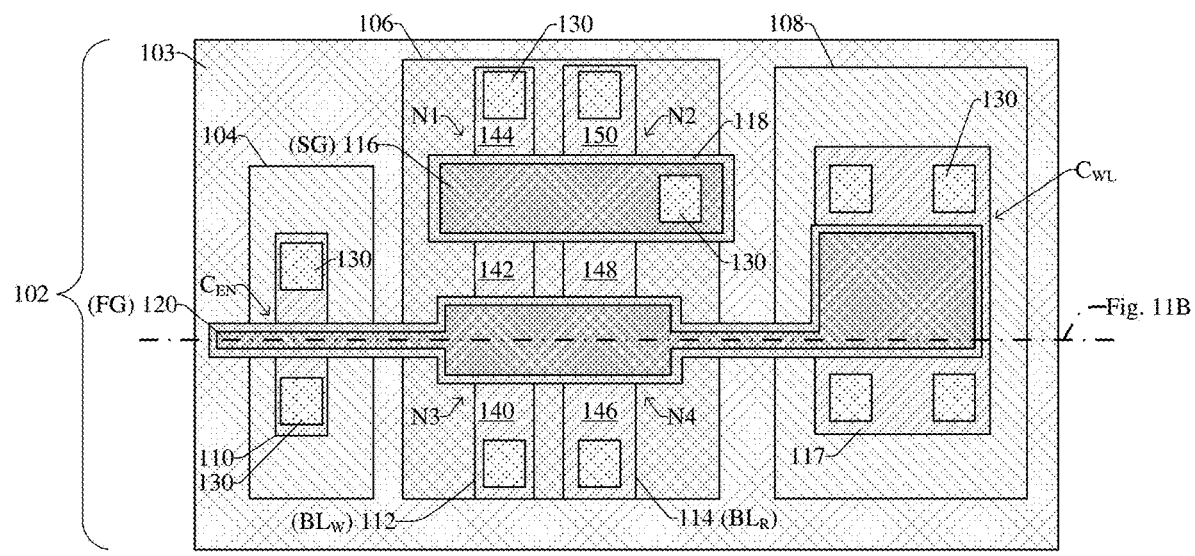
Figure 11B:
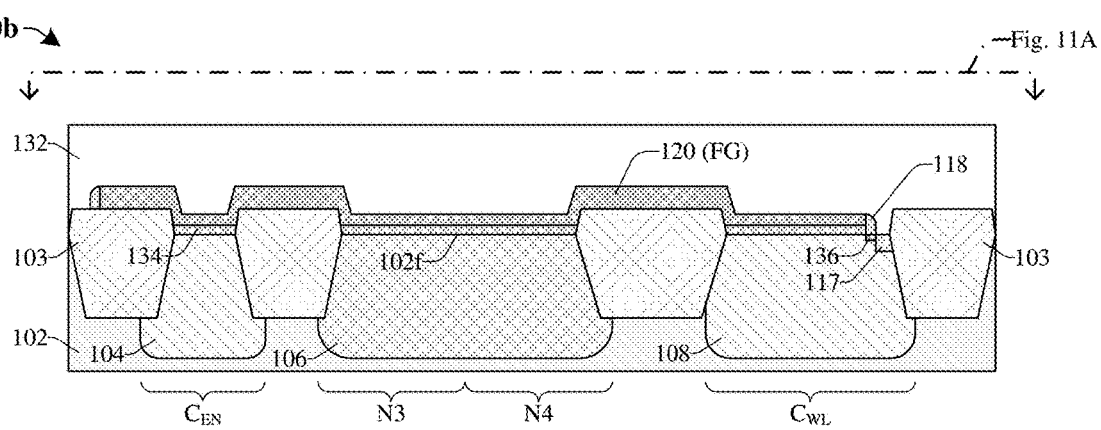

As shown in FIGS. 11A-11B, a plurality of conductive vias 130 are formed over the substrate 102 and may contact conductive structures (e.g., the SG 116) and/or doped regions of the substrate 102. Further, an interconnect dielectric structure 132 is formed over the substrate 102. In some embodiments, a conductive via 130 is not formed over the FG 120, such that the interconnect dielectric structure 132 continuously extends along an upper surface of the FG 120. In some embodiments, the conductive vias 130 may, for example, be or comprise aluminum, copper, tungsten, tantalum, another suitable conductive material, or a combination of the foregoing. In various embodiments, the conductive vias 130 may be formed by a single damascene process. The interconnect dielectric structure 132 may be or comprise a plurality of inter-level dielectric (ILD) layers. The ILD layers may, for example, each be or comprise silicon dioxide, a low-k dielectric material, an extreme low-k dielectric material, another suitable dielectric material, or a combination of the foregoing. In various embodiments, the interconnect dielectric structure 132 may, for example, be deposited by CVD, PVD, ALD, or another suitable deposition process. In yet further embodiments, additional conductive vias (not shown) and/or a plurality of conductive wires (not shown) may be formed over the conductive vias 130 by a single damascene process and/or a dual damascene process.

Figure 12:
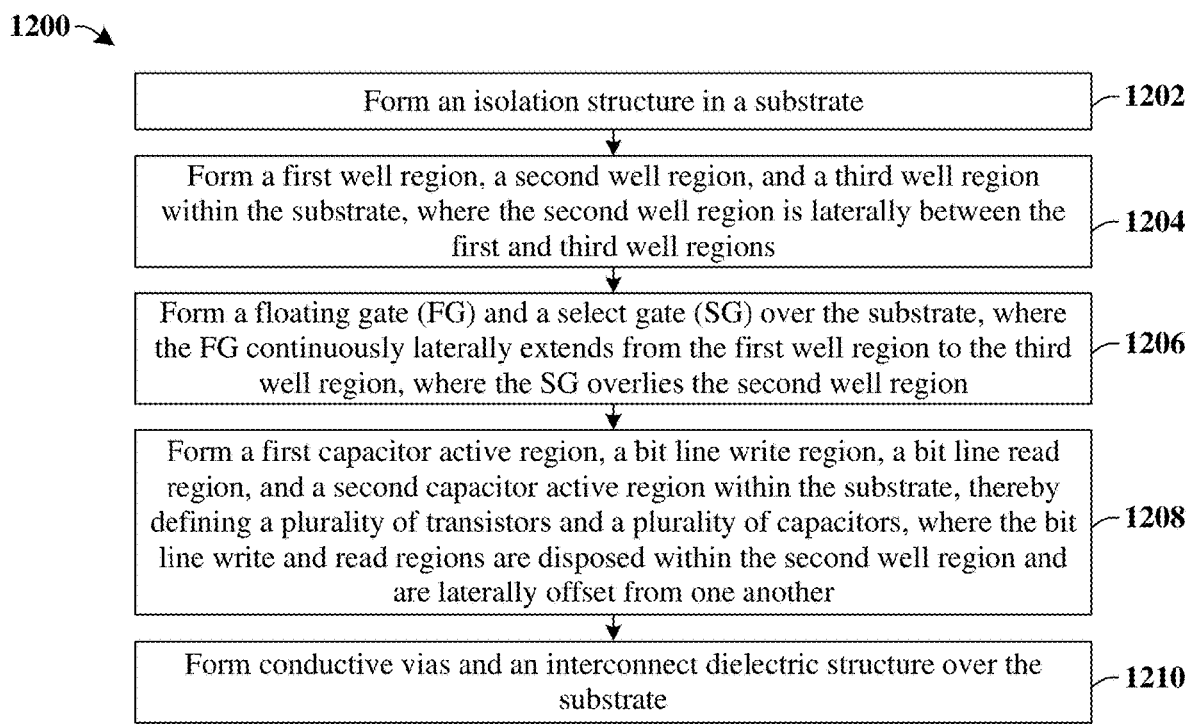
FIG. 12 illustrates a flowchart of some embodiments of a method for forming a memory device that includes a floating gate overlying a first bit line active region and a second bit line active region.

As illustrated in FIG. 12, a flowchart 1200 of some embodiments of a method for forming a memory cell including a floating gate overlying a first bit line active region and a second bit line active region. While the flowchart 1200 of FIG. 12 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1202, an isolation structure is formed in a substrate. FIGS. 7A and 7B illustrate various views 700a and 700b corresponding to some embodiments of act 1202.

At act 1204, a first well region, a second well region, and a third well region are formed within the substrate. The second well region is laterally between the first and third well regions. FIGS. 8A and 8B illustrate various views 800a and 800b corresponding to some embodiments of act 1204.

At act 1206, a first floating gate (FG) and a select gate (SG) are formed over the substrate. The FG continuously laterally extends from the first well region to the third well region and the SG overlies the second well region. FIGS. 9A and 9B illustrate various views 900a and 900b corresponding to some embodiments of act 1206.

At act 1208, a first capacitor active region, a bit line write region, a bit line read region, and a second capacitor active region are formed within the substrate, thereby defining a plurality of capacitors and a plurality of transistors. The bit line write region and the bit line read region are disposed within the second well region and are laterally offset from one another. FIGS. 10A and 10B illustrate various views 1000a and 1000b corresponding to some embodiments of act 1208.

At act 1210, conductive vias and an interconnect dielectric structure are formed over the substrate. FIGS. 11A and 11B illustrate various views 1100a and 1100b corresponding to some embodiments of act 1210.

Figures 13A, 13B, 13C:
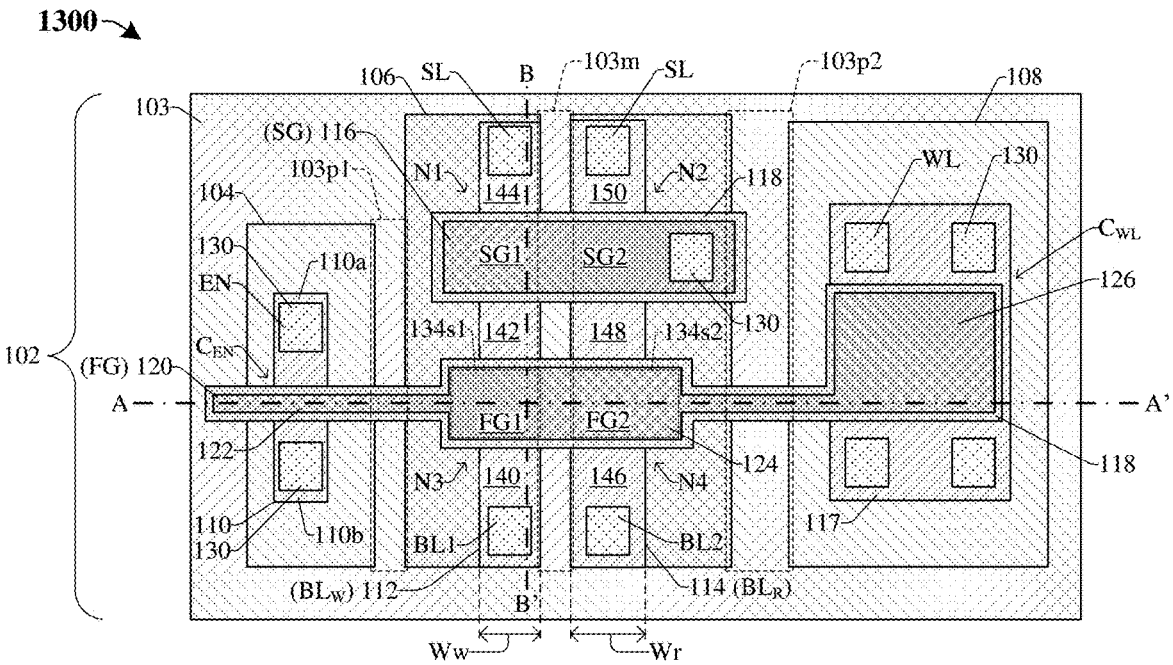
FIGS. 13A-13C illustrate various views of some embodiments of a memory cell according to some alternative embodiments of the memory cell of FIGS. 1A-1C.

FIGS. 13A-13C illustrate various views of a memory cell 1300, according to some embodiments of the disclosure. The memory cell 1300 may comprise some aspects of the memory cell 100 in FIGS. 1A-1C (and vice versa); and thus, the features and/or reference numerals explained above with regards to FIGS. 1A-1C are also applicable to the memory cell 1300 in FIGS. 13A-13C. FIG. 13A illustrates a layout view of some embodiments of the memory cell 1300 from the front-side 102f of the substrate 102. FIG. 13B illustrates a cross-sectional view of some embodiments of the memory cell 1300 taken along the line A-A' of FIG. 13A. FIG. 13C illustrates a cross-sectional view of various embodiments of the memory cell 1300 taken along the line B-B' of FIG. 13B.

The memory cell 100 includes the isolation structure 103 disposed within the substrate 102. The isolation structure 103 extends from the front-side 102f to a point below the front-side 102f. The isolation structure 103 may, for example, be configured as a shallow trench isolation (STI) structure or another suitable isolation structure. The isolation structure 103 may, for example, be or comprise silicon dioxide, silicon nitride, silicon carbide, silicon oxycarbide, silicon oxynitride, another dielectric material, or any combination of the foregoing. In addition, the isolation structure 103 is configured to demarcate a device region of the substrate 102, where the first well region 104, the second well region 106, and the third well region 108 are disposed within the device region of the substrate 102. Thus, the isolation structure 103 laterally encloses the first well region 104, the second well region 106, and the third well region 108 and is configured to electrically isolate the first, second, and third well regions 104, 106, 108 from one another. In some embodiments, the second well region 106 may be referred to as a middle well region, the first well region 104 may be referred to as a first outer well region, and the third well region 108 may be referred to as a second outer well region.

Further, the isolation structure 103 comprises a middle isolation segment 103m disposed laterally between a first peripheral isolation segment 103p1 and a second peripheral isolation segment 103p2. In various embodiments, a top surface of the middle isolation segment 103m is disposed below a top surface of the first and second peripheral isolation segments 103p1, 103p2. In further embodiments, a bottom surface of the middle isolation segment 103m is disposed above a bottom surface of the first and second peripheral isolation segments 103p1, 103p2. The middle isolation segment 103m is disposed in a middle region of the second well region 106. The FG 120 continuously extends from the first peripheral isolation segment 103p1, across the middle isolation segment 103m, to the second peripheral isolation segment 103p2 of the isolation structure. In addition, the FG 120 continuously extends from a first sidewall 1302 of the middle isolation segment 103m, along the top surface of the middle isolation segment 103m, to a second sidewall 1304 of the middle isolation segment 103m. The first floating gate FG1 and the second floating gate FG2 are disposed on opposing sides of the middle isolation segment 103m. The first select gate SG1 and the second select gate SG2 are disposed on opposing sides of the middle isolation segment 103m.

Further, the dielectric structure 134 comprises a first dielectric segment 134s1 and a second dielectric segment 134s2. The first dielectric segment 134s1 is disposed between the first floating gate FG1 and the second well region 106, and is disposed along the first sidewall 1302 of the middle isolation segment 103m. The second dielectric segment 134s2 is disposed between the second floating gate FG2 and the second well region 106, and is disposed along the second sidewall 1304 of the middle isolation segment 103m. Thus, the first and second dielectric segments 134s1, 134s2 are laterally separated from one another by a non-zero distance.

In some embodiments, the bit line write region 112 and the bit line read region 114 are disposed on opposing sides of the middle isolation segment 103m of the isolation structure 103. For example, the bit line write region 112 continuously extends along the first sidewall 1302 of the middle isolation segment 103m and the bit line read region 114 continuously extends along the second sidewall 1304 of the middle isolation segment 103m. The middle isolation segment 103m of the isolation structure 103 is configured to electrically isolate the bit line write region 112 and the bit line read region 114 from one another. For example, during a programing operation performed on the memory cell 1300, charge carriers (e.g., electrons) may be injected from the first source/drain region 140 of the bit line write region 112 to the FG 120 by Fowler-Nordheim (FN) tunneling. In such embodiments, the programing operation may damage the first dielectric segment 134s1 of the dielectric structure 134 disposed between the first floating gate FG1 and the second well region 106 and/or the bit line write region 112. Further, during the programing operation, the middle isolation segment 103m of the isolation structure 103 is configured to prevent the charge carriers from traversing the second well region 106 to the bit line read region 114. Thus, the middle isolation segment 103m increases electrical isolation between the bit line write region 112 and bit line read region 114, thereby increasing performance of the memory cell 1300.

In further embodiments, during a read operation performed on the memory cell 1300, a data state of the memory cell 1300 may be accessed at the sixth source/drain region 150 of the bit line read region 114 by way of the second storage transistor N4 and the second select transistor N2. In such embodiments, because the bit line write region 112 and the bit line read region 114 are disposed on opposing sides of the middle isolation segment 103m of the isolation structure 103, the damage to the first dielectric segment 134s1 of the dielectric structure 134 by the programming operation may not adversely affect the read operation performed on the memory cell 1300. For example, the second dielectric segment 134s2 is laterally offset from the first dielectric segment 134s1 by virtue of the middle isolation segment 103m of the isolation structure 103 such that the second dielectric segment 134s2 may not be damaged by the programming operation. This may mitigate inaccurate read operations, increase a number of write operations (i.e., erase and/or program operations) that may be performed on the memory cell 1300, and/or increase a reliability of the memory cell 1300.

Figure 14:
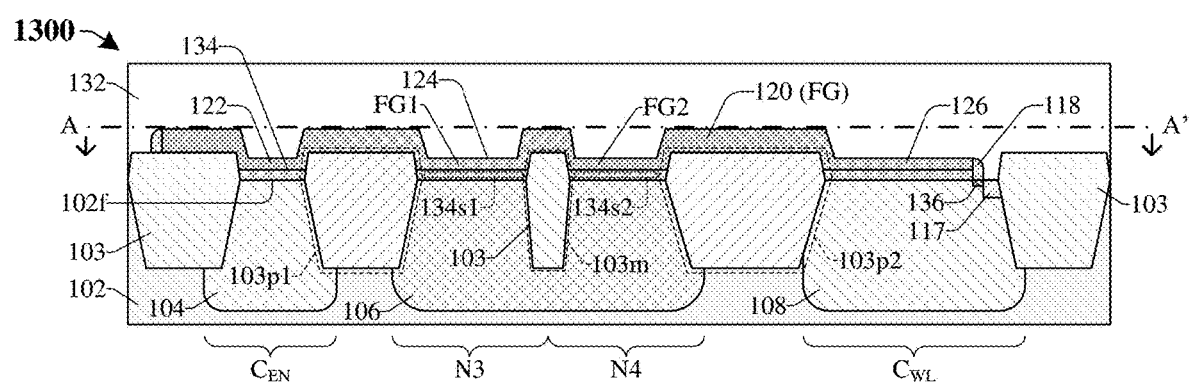
FIG. 14 illustrates a cross-sectional view of some different embodiments of the memory cell of FIGS. 13A-13C.

FIG. 14 illustrates a cross-sectional view of some alternative embodiments of the memory cell 1300 taken along the line A-A' of FIG. 13A, in which the top surface of the middle isolation segment 103m of the isolation structure 103 is vertically aligned with the top surface of the first and second peripheral isolation segments 103p1, 103p2. In further embodiments, the bottom surface of the middle isolation segment 103m of the isolation structure 103 is vertically aligned with the bottom surface of the first and second peripheral isolation segments 103p1, 103p2. This, in part, may further increase electrical isolation between the bit line write region (112 of FIG. 13A) and the bit line read region (114 of FIG. 13A).

FIGS. 15A-19B illustrate a series of various views 1500a-1900b of some embodiments of a second method for forming a memory cell including a floating gate overlying a first bit line active region and a second bit line active region. Figures with a suffix of "A" illustrate a layout view of the memory cell during various formation processes. Figures with a suffix of "B" are taken along a cut line of a corresponding Figure with the suffix of "A". Although the various views 1500a-1900b shown in FIGS. 15A-19B are described with reference to a second method, it will be appreciated that the structures shown in FIGS. 15A-19B are not limited to the second method but rather may stand alone separate of the second method. Although FIGS. 15A-19B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 15A:
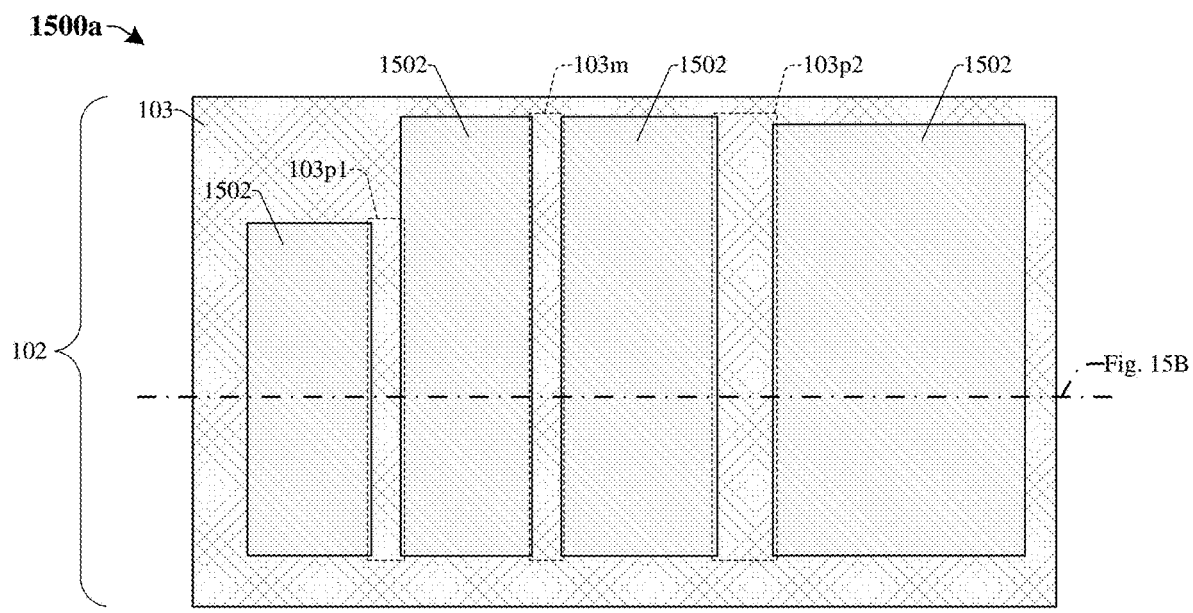
FIGS. 15A-19B illustrate various views of some embodiments of a second method for forming a memory cell including a floating gate overlying a first bit line active region and a second bit line active region.
Figure 15B:
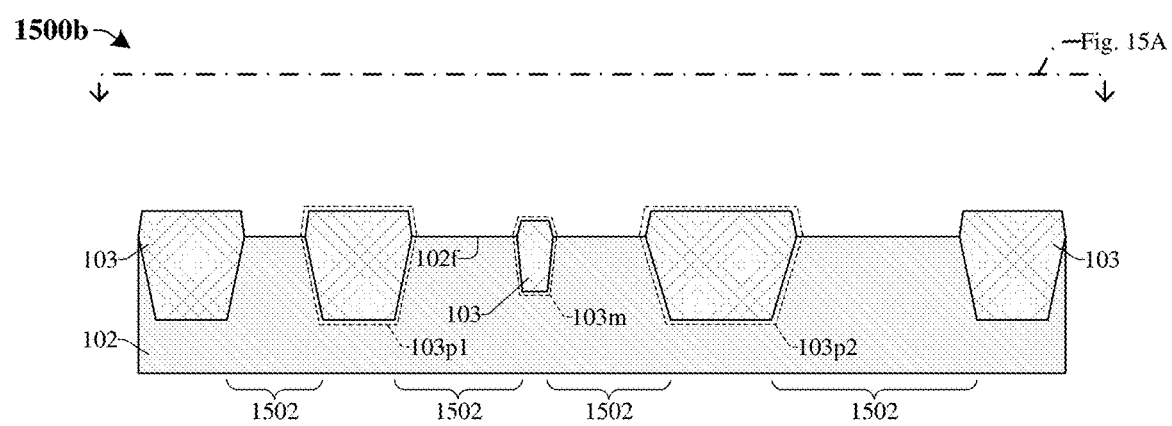

As shown in FIGS. 15A-15B, a substrate 102 is provided and an isolation structure 103 is formed in the substrate 102. In some embodiments, the isolation structure 103 extends into a front-side 102f of the substrate 102 and is formed such that the isolation structure 103 demarcates a device region 1502 of the substrate 102. In various embodiments, the device region 1502 of the substrate 102 comprises one or more polygonal region(s) such that the isolation structure 108 has one or more polygonal ring-shaped layout(s).

In some embodiments, the substrate 102 may, for example, be or comprise a bulk semiconductor substrate (e.g., a bulk silicon substrate), a silicon-on-insulator (SOI) substrate, or another suitable substrate material and/or may comprise a first doping type (e.g., p-type). In some embodiments, the isolation structure 103 may be formed by selectively etching the substrate 102 to form a trench in the substrate 102 that extends into the substrate 102 from the front-side 102f of the substrate 102, and subsequently filling (e.g., by chemical vapor deposition (CVD), physical vapor deposition (PVD), atomic layer deposition (ALD), thermal oxidation, or another suitable deposition or growth process) the trench with a dielectric material. In some embodiments, the dielectric material may, for example, be or comprise silicon dioxide, silicon carbide, silicon nitride, another suitable dielectric material, or a combination of the foregoing. In further embodiments, the substrate 102 may be selectively etched by forming a masking layer (not shown) on the front-side 102f and subsequently exposing the substrate 102 to an etchant configured to selectively remove unmasked portions of the substrate 102. In some embodiments, the isolation structure 103 may, for example, be configured as a shallow trench isolation (STI) structure, a deep trench isolation (DTI) structure, or another suitable isolation structure. The isolation structure 103 comprises a middle isolation segment 103m disposed laterally between a first peripheral isolation segment 103p1 and a second peripheral isolation segment 103p2. In various embodiments, a top surface of the middle isolation segment 103m is disposed below a top surface of the first and second peripheral isolation segments 103p1, 103p2. In yet further embodiments, a bottom surface of the middle isolation segment 103m is disposed above a bottom surface of the first and second peripheral isolation segments 103p1, 103p2.

Figure 16A:
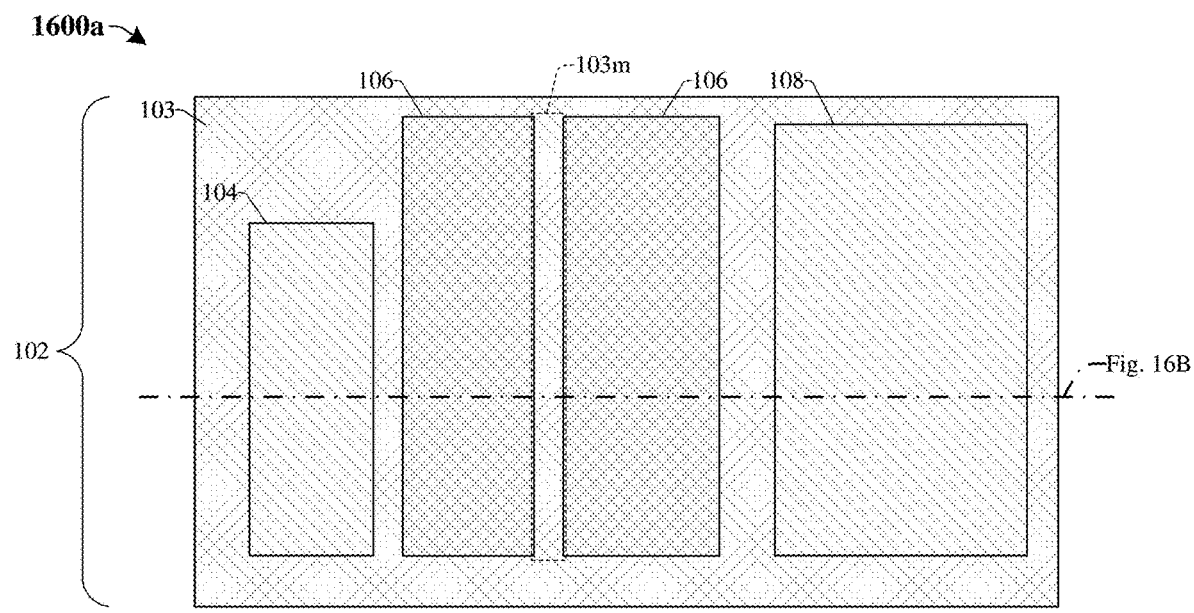
Figure 16B:
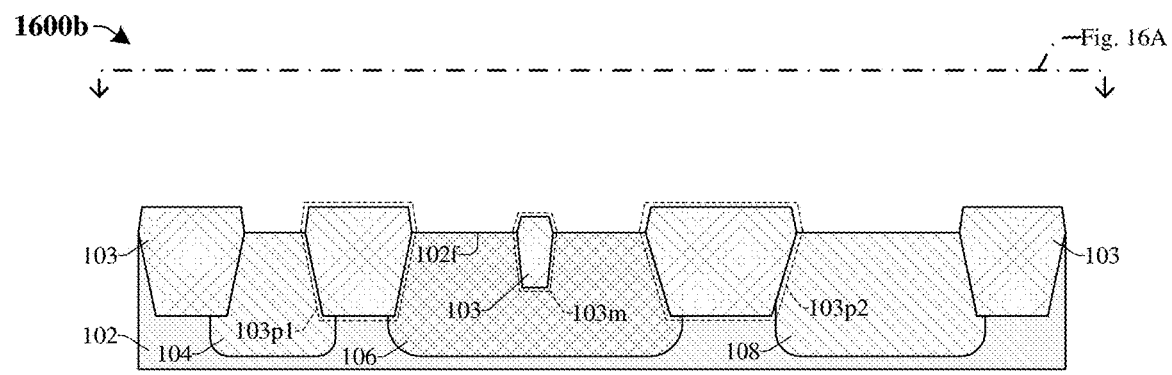

As shown in FIGS. 16A-16B, one or more selective ion implantation processes may be performed to form a first well region 104, a second well region 106, and a third well region 108 in the device region (1502 of FIGS. 15A-15B) of the substrate 102. In some embodiments, the first and third well regions 104, 108 may each be discrete regions of the substrate 102 having a second doping type (e.g., n-type) opposite the first doping type. In some embodiments, the first doping type is p-type and the second doping type is n-type, or vice versa. In further embodiments, the second well region 106 may be a discrete region of the substrate 102 having the first doping type (e.g., p-type) with a doping concentration greater than a doping concentration of the substrate 102. In some embodiments, the one or more selective ion implantation processes may each include: forming a masking layer (not shown) over the front-side 102f of the substrate 102 and selectively implanting ions in the substrate 102 according to the masking layer. In some embodiments, before forming the first, second, and third well regions 104, 106, 108 one or more N-buried layers (NBLs) (not shown) and/or one or more deep N-wells (DNWs) (not shown) may be formed within the substrate 102 such that the NBLs and/or DNWs underlie the first, second, and/or third well regions 104, 106, 108. In further embodiments, after forming the one or more NBLs and/or DNWs, one or more input/output contact regions (not shown) may be formed within the substrate 102. In some embodiments, the one or more input/output contact regions may be doped regions of the substrate 102 configured to facilitate an electrical connection with the substrate 102. In some embodiments, the one or more input/out contact regions may include a bulk substrate contact region configured to facilitate application of a bulk substrate voltage to the substrate 102.

In addition, as illustrated in the cross-sectional view 1600b of FIG. 16B, the middle isolation segment 103m of the isolation structure 103 is disposed within a middle region of the second well region 106. In some embodiments, the second well region 106 extends from a first sidewall of the middle isolation segment 103m, along the bottom surface of the middle isolation segment 103m, to a second sidewall of the middle isolation segment 103m. Further, the second well region 106 continuously extends from the first peripheral isolation segment 103p1 of the isolation structure 103 to the second peripheral isolation segment 103p2 of the isolation structure 103

Figure 17A:
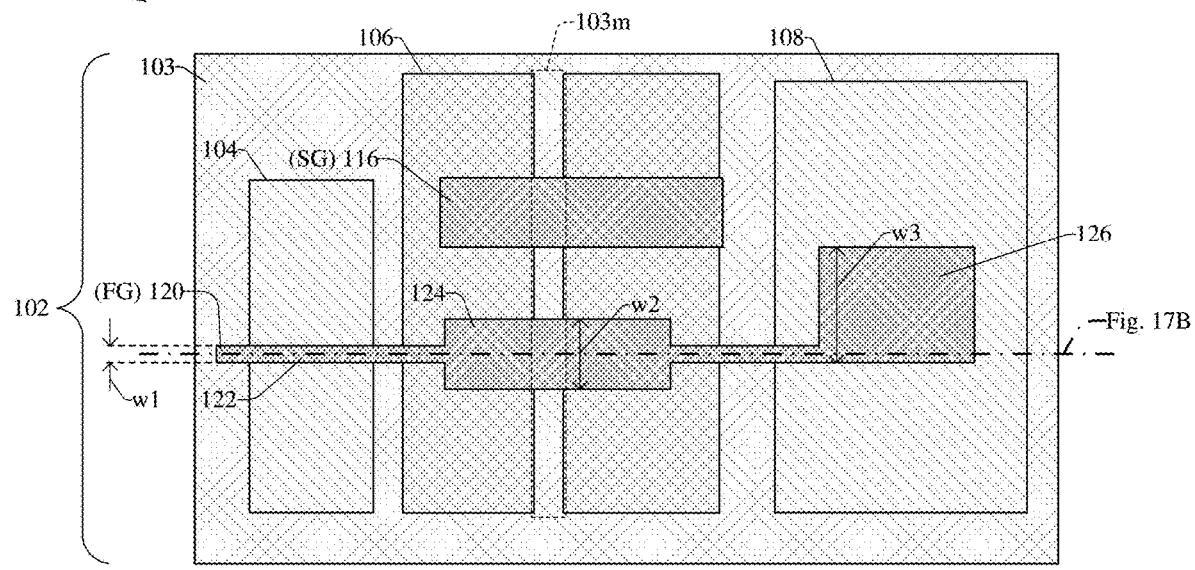
Figure 17B:
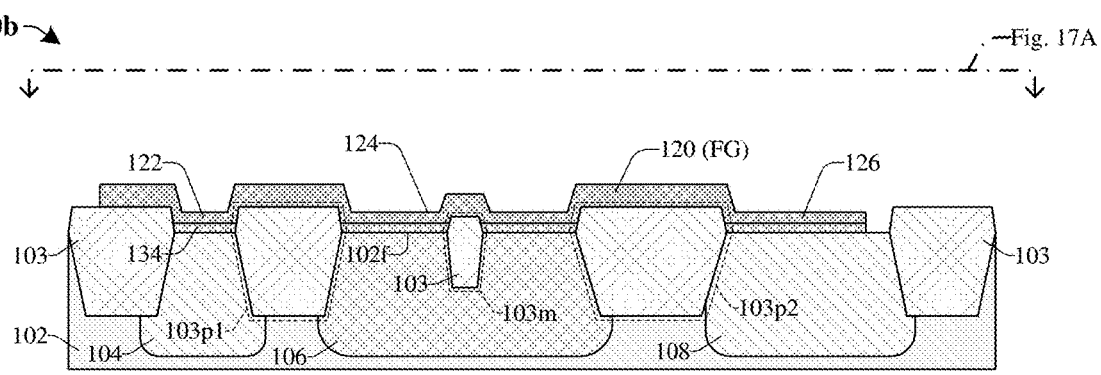

As shown in FIGS. 17A-17B, a dielectric structure 134 and a select gate dielectric structure (152 of FIG. 13C) (not shown) are formed over the front-side 102f of the substrate 102. Further, a floating gate (FG) 120 and a select gate (SG) 116 are respectively formed on the dielectric structure 134 and the select gate dielectric structure (152 of FIG. 13C). In some embodiments, the dielectric structure 134 and/or the select gate dielectric structure (152 of FIG. 13C) may, for example, respectively be deposited by CVD, PVD, ALD, thermal oxidation, or another suitable deposition or growth process. In yet further embodiments, the dielectric structure 134 and/or the select gate dielectric structure (152 of FIG. 13C) may respectively, for example, be or comprise silicon dioxide, a high-k dielectric material, or another suitable dielectric material. Further, the FG 120 may be deposited (e.g., by CVD, PVD, ALD, sputtering, or another suitable growth or deposition process) on the dielectric structure 134 and the SG 116 may be deposited (e.g., by CVD, PVD, ALD, sputtering, or another suitable growth or deposition process) on the select gate dielectric structure (152 of FIG. 13C). Subsequently, the FG 120, the SG 116, the dielectric structure 134, and the select gate dielectric structure (152 of FIG. 13C) may be patterned according to a masking layer (not shown). In yet further embodiments, the FG 120 and/or the SG 116 may, for example, respectively be or comprise polysilicon such as intrinsic polysilicon and/or doped polysilicon, aluminum, another suitable conductive material, or a combination of the foregoing.

Also as illustrated in FIGS. 17A-17B, the FG 120 is a continuous conductive structure that laterally extends from over the first well region 104 to over the third well region 108. In some embodiments, a first FG portion 122 of the FG 120 overlying the first well region 104 may have a width w1 and a second FG portion 124 of the FG 120 overlying the second well region 106 may have a width w2 greater than the width w1 of the first FG portion 122. Further, a third FG portion 126 of the FG 120 may have a width w3 greater than the width w2 of the second FG portion 124. Further, the dielectric structure 134 is disposed along opposing sidewalls of the middle isolation segment 103m of the isolation structure 103. In some embodiments, the FG 120 continuously extends from the first peripheral isolation segment 103p1, along the middle isolation segment 103m, to the second peripheral isolation segment 103p2 of the isolation structure 103. Further, a first height of the FG 120 over the middle isolation segment 103m is less than a second height of the FG 120 over the first peripheral isolation segment 103p1 and/or the second peripheral isolation segment 103p2 of the isolation structure 103. Furthermore, the FG 120 continuously extends from a first sidewall of the middle isolation segment 103m, along a top surface of the middle isolation segment 103m, to a second sidewall of the middle isolation segment 103m. The dielectric structure 134 contacts the first sidewall of the middle isolation segment 103m and the second sidewall of the middle isolation segment 103m.

Figure 18A:
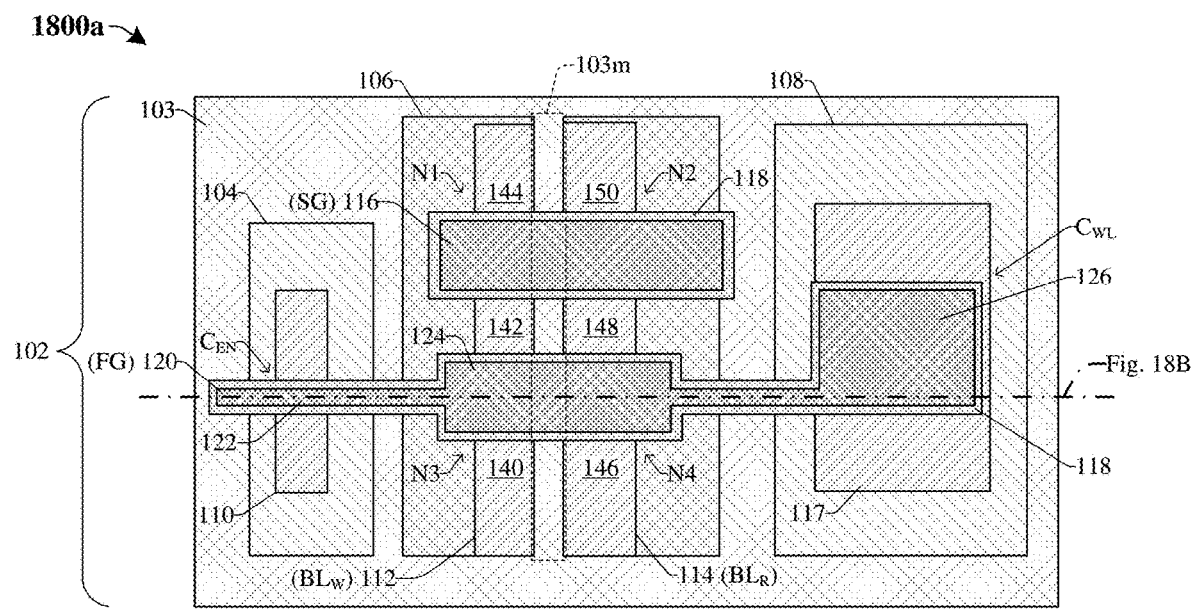
Figure 18B:
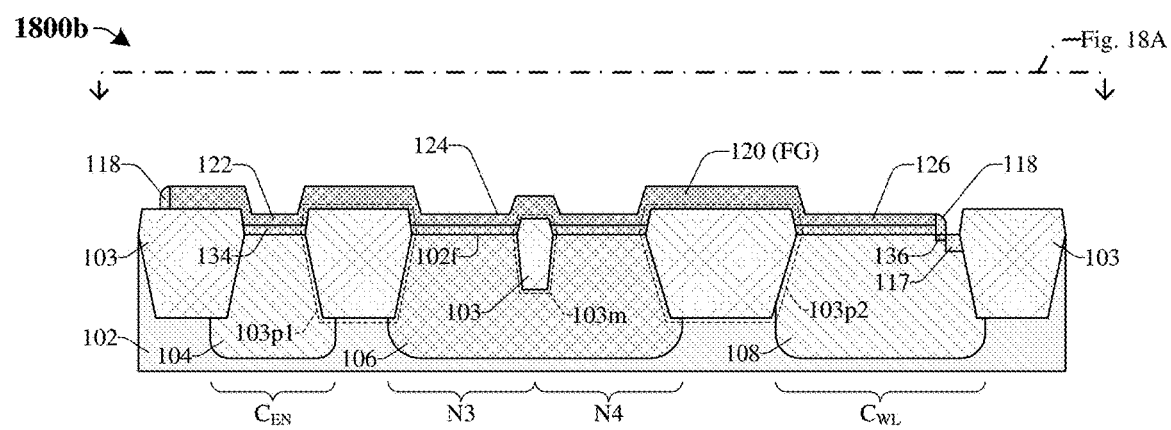

As shown in FIGS. 18A-18B, sidewall spacer structures 118 are formed along sidewalls of the FG 120 and sidewalls of the SG 116. In some embodiments, the sidewall spacer structures 118 may be formed by depositing (e.g., by CVD, PVD, ALD, thermal oxidation, etc.) a spacer material over the substrate 102 and along sidewalls of the FG 120 and the SG 116; and subsequently patterning the spacer material to remove the spacer material from horizontal surfaces, thereby forming the sidewall spacer structures 118. In some embodiments, the sidewall spacer structures 118 may, for example, be or comprise silicon nitride, silicon carbide, or another suitable dielectric material. In some embodiments, before forming the sidewall spacer structures 118, lightly doped regions 136 may be formed within the substrate 102 and may be aligned with one or more sidewalls of the SG 116 and one or more sidewalls of the FG 120. The lightly doped regions 136 may, for example, be formed by selectively implanting ions into the substrate 102 according to a masking layer (not shown). In some embodiments, the lightly doped regions 136 may comprise the second doping type (e.g., n-type).

Further, as shown in FIGS. 18A-18B, a first capacitor active region 110, a bit line write region 112, a bit line read region 114, and a second capacitor active region 117 are formed within the substrate 102. The first capacitor active region 110 is formed on opposing sides of the first FG portion 122 and is formed within the first well region 104. The bit line write region 112 and the bit line read region 114 are respectively formed on opposing sides of the second FG portion 124 and opposing sides of the SG 116 within the second well region 106. The second capacitor active region 117 is formed around sidewalls of the third FG portion 126 within the third well region 108. In some embodiments, the first capacitor active region 110, the bit line write region 112, the bit line read region 114, and the second capacitor active region 117 may each be formed by a selective ion implantation process that utilizes a masking layer (not shown) disposed over the front-side 102f of the substrate 102 to selectively implant dopants into the substrate 102. In further embodiments, the first capacitor active region 110, the bit line write region 112, the bit line read region 114, and the second capacitor active region 117 may each comprise the second doping type (e.g., n-type). This in turn forms a plurality of transistors N1-N4 and a plurality of capacitors $C_{EN}$, $C_{WL}$. In yet further embodiments, the bit line write region 112 is laterally offset from the bit line read region 114 by a non-zero distance.

Furthermore, as shown in FIG. 18A, the bit line write region 112 and the bit line read region 114 are formed on opposing sides of the middle isolation segment 103m of the isolation structure 103. The middle isolation segment 103m of the isolation structure 103 is configured to electrically isolate the bit line write region 112 from the bit line read region 114. In further embodiments, the sidewall spacer structures 118 directly overlie the middle isolation segment 103m of the isolation structure 103. The sidewall spacer structure 118 disposed along sidewalls of the FG 120 continuously extends from the first peripheral isolation segment 103p1, along the middle isolation segment 103m, to the second peripheral isolation segment 103p2 of the isolation structure 103. The sidewall spacer structure 118 disposed along sidewalls of the SG 116 extends continuously from the second peripheral isolation segment 103p2 to the middle isolation segment 103m of the isolation structure 103.

Figure 19A:
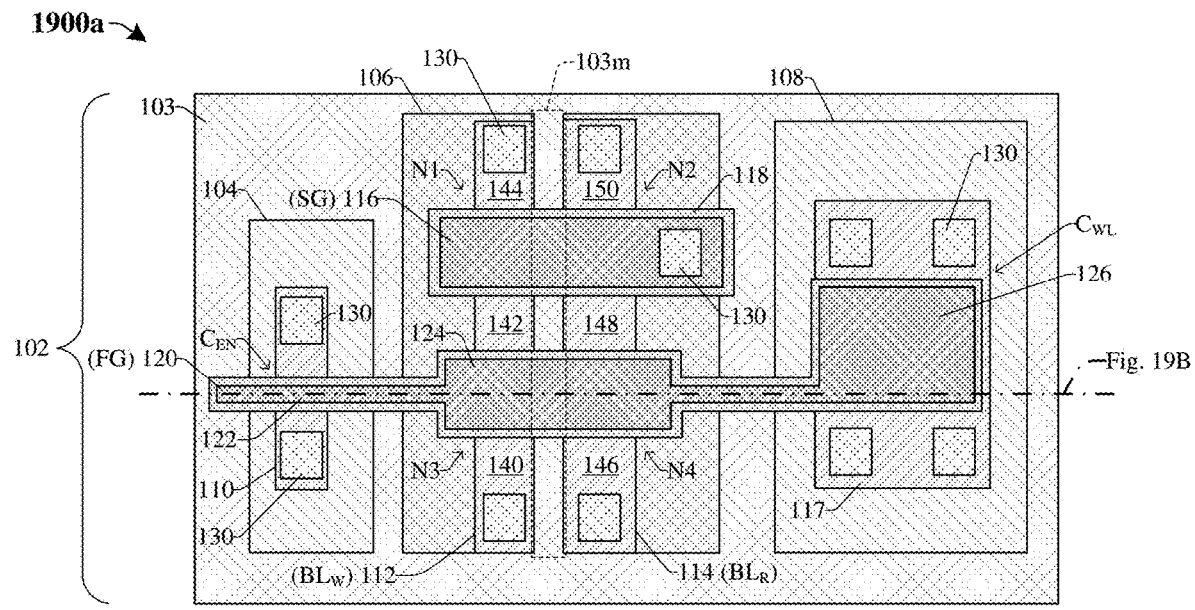
Figure 19B:
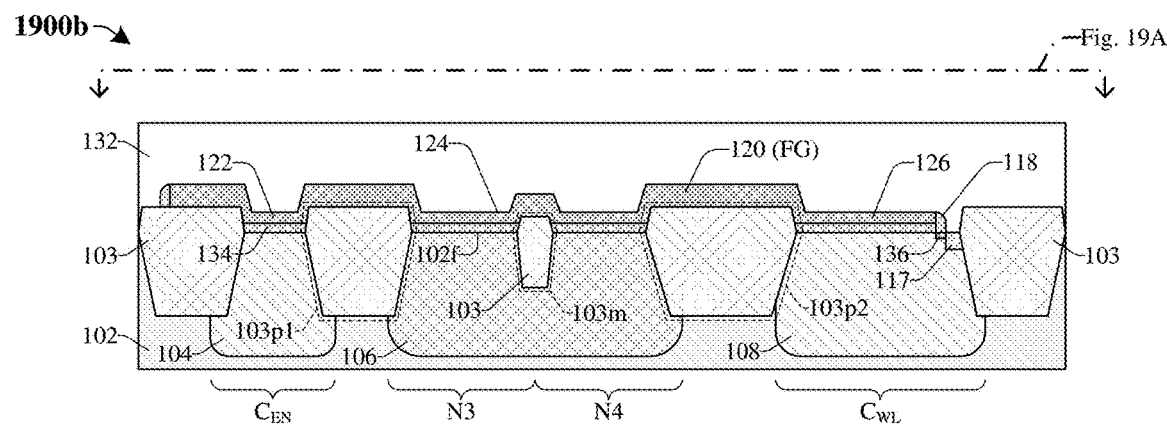

As shown in FIGS. 19A-19B, a plurality of conductive vias 130 are formed over the substrate 102 and may contact conductive structures (e.g., the SG 116) and/or doped regions of the substrate 102. Further, an interconnect dielectric structure 132 is formed over the substrate 102. In some embodiments, a conductive via 130 is not formed over the FG 120, such that the interconnect dielectric structure 132 continuously extends along an upper surface of the FG 120. In some embodiments, the conductive vias 130 may, for example, be or comprise aluminum, copper, tungsten, tantalum, another suitable conductive material, or a combination of the foregoing. In various embodiments, the conductive vias 130 may be formed by a single damascene process. The interconnect dielectric structure 132 may be or comprise a plurality of inter-level dielectric (ILD) layers. The ILD layers may, for example, each be or comprise silicon dioxide, a low-k dielectric material, an extreme low-k dielectric material, another suitable dielectric material, or a combination of the foregoing. In various embodiments, the interconnect dielectric structure 132 may, for example, be deposited by CVD, PVD, ALD, or another suitable deposition process. In yet further embodiments, additional conductive vias (not shown) and/or a plurality of conductive wires (not shown) may be formed over the conductive vias 130 by a single damascene process and/or a dual damascene process.

As illustrated in FIG. 20, a flowchart 2000 of some embodiments of a second method for forming a memory cell including a floating gate overlying a first bit line active region and a second bit line active region. While the flowchart 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2002, an isolation structure is formed in a substrate such that the isolation structure comprises a middle isolation segment disposed laterally between a first peripheral isolation segment and a second peripheral isolation segment. FIGS. 15A and 15B illustrate various views 1500a and 1500b corresponding to some embodiments of act 2002.

At act 2004, a first well region, a second well region, and a third well region are formed within the substrate. The second well region is laterally between the first and third well regions and the middle isolation segment of the isolation structure is disposed within the second well region. FIGS. 16A and 16B illustrate various views 1600a and 1600b corresponding to some embodiments of act 2004.

At act 2006, a first floating gate (FG) and a select gate (SG) are formed over the substrate. The FG continuously laterally extends from the first well region to the third well region. Further, the SG overlies the second well region and the middle isolation segment of the isolation structure. FIGS. 17A and 17B illustrate various views 1700a and 1700b corresponding to some embodiments of act 2006.

At act 2008, a first capacitor active region, a bit line write region, a bit line read region, and a second capacitor active region are formed within the substrate, thereby defining a plurality of capacitors and a plurality of transistors. The bit line write region and the bit line read region are disposed within the second well region and are disposed on opposing sides of the middle isolation segment of the isolation structure. FIGS. 18A and 18B illustrate various views 1800a and 1800b corresponding to some embodiments of act 2008.

At act 2010, conductive vias and an interconnect dielectric structure are formed over the substrate. FIGS. 19A and 19B illustrate various views 1900a and 1900b corresponding to some embodiments of act 2010.

Accordingly, in some embodiments, the present disclosure relates to a memory cell comprising a plurality of capacitors and a plurality of transistors disposed over and/or within a substrate, in which the memory cell is in a two-capacitor-four-transistor (2C4T) configuration. The memory cell includes a bit line write region and a bit line read region respectively disposed within a well region and laterally offset from one another. An isolation structure is disposed within the substrate, such that the isolation structure comprises a middle isolation segment disposed laterally between the bit line write region and the bit line read region.

In some embodiments, the present application provides an integrated chip including a first well region, a second well region, and a third well region disposed within a substrate, wherein the second well region is spaced laterally between the first and third well regions; an isolation structure disposed within a front-side surface of the substrate, wherein the isolation structure laterally surrounds the first well region, the second well region, and the third well region; a floating gate overlying the front-side surface of the substrate, wherein the floating gate continuously laterally extends from the first well region to the third well region; a dielectric structure disposed between the substrate and the floating gate; a bit line write region disposed within the second well region, wherein the bit line write region comprises source/drain regions disposed on opposite sides of the floating gate; and a bit line read region disposed within the second well region and laterally offset from the bit line write region by a non-zero distance, wherein the bit line read region comprises source/drain regions disposed on the opposite sides of the floating gate.

In some embodiments, the present application provides an integrated chip including a well region disposed within a substrate; an isolation structure disposed within a front-side surface of the substrate, wherein the isolation structure laterally surrounds the well region; a bit line write region disposed within the well region; a bit line read region disposed within the well region and laterally offset from the bit line write region by a non-zero distance; a first storage transistor comprising source/drain regions disposed within the bit line write region and a first gate electrode comprised of a first floating gate portion of a floating gate, wherein the source/drain regions of the first storage transistor are disposed on opposing sides of the floating gate, wherein the floating gate overlies the well region of the substrate; and a second storage transistor comprising source/drain regions disposed within the bit line read region and a second gate electrode comprised of a second floating gate portion of the floating gate, wherein the source/drain regions of the second storage transistor are disposed on the opposing sides of the floating gate.

In some embodiments, the present application provides a method for forming a memory device, the method includes forming an isolation structure in a substrate, wherein the isolation structure comprises inner sidewalls that demarcate a device region of the substrate; doping the substrate to form a middle well region within the device region of the substrate; forming a floating gate over at least a portion of the middle well region and at least a portion of the isolation structure; and doping the substrate to form a bit line read region within a first portion of the middle well region and a bit line write region within a second portion of the middle well region, wherein the bit line read region includes source/drain regions on opposite sides of the floating gate and the bit line write region includes source/drain regions on the opposite sides of the floating gate, wherein the first portion of the middle well region is laterally offset from the second portion of the middle well region by a non-zero distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a first well region, a second well region, and a third well region disposed within a substrate, wherein the second well region is spaced laterally between the first and third well regions;
   an isolation structure disposed within a front-side surface of the substrate, wherein the isolation structure laterally surrounds the first well region, the second well region, and the third well region;
   a floating gate overlying the front-side surface of the substrate, wherein the floating gate continuously laterally extends from the first well region to the third well region;
   a dielectric structure disposed between the substrate and the floating gate;
   a bit line write region disposed within the second well region, wherein the bit line write region comprises source/drain regions disposed on opposite sides of the floating gate; and
   a bit line read region disposed within the second well region and laterally offset from the bit line write region by a non-zero distance, wherein the bit line read region comprises source/drain regions disposed on the opposite sides of the floating gate.

2. The integrated chip of claim 1, wherein a width of the bit line write region is less than a width of the bit line read region.

3. The integrated chip of claim 1, wherein the floating gate has a first width over the first well region, a second width over the second well region, and a third width over the third well region, wherein the first width is less than the second width and the second width is less than the third width.

4. The integrated chip of claim 1, wherein the isolation structure comprises a middle isolation segment disposed within the second well region, wherein the bit line write region is disposed along a first sidewall of the middle isolation segment and the bit line read region is disposed along a second sidewall of the middle isolation segment, wherein the first sidewall is opposite the second sidewall.

5. The integrated chip of claim 4, wherein the second well region continuously extends from the first sidewall, along a bottom surface of the middle isolation segment, to the second sidewall.

6. The integrated chip of claim 4, wherein the dielectric structure comprises a first dielectric segment and a second dielectric segment laterally offset from one another by a non-zero distance, wherein the first dielectric segment is disposed along the first sidewall of the middle isolation segment and the second dielectric segment is disposed along the second sidewall of the middle isolation segment.

7. The integrated chip of claim 4, wherein the isolation structure further comprises a first peripheral isolation segment and a second peripheral isolation segment, wherein the middle isolation segment is disposed laterally between the first and second peripheral isolation segments, wherein the floating gate continuously laterally extends from the first peripheral isolation segment, along the middle isolation segment, to the second peripheral isolation segment.

8. The integrated chip of claim 7, wherein a height of the floating gate over the middle isolation segment is less than a height of the floating gate over the first peripheral isolation segment.

9. The integrated chip of claim 7, wherein a bottom surface of the middle isolation segment is vertically above a bottom surface of the first peripheral isolation segment.

10. An integrated chip comprising:
    a well region disposed within a substrate;
    an isolation structure disposed within a front-side surface of the substrate, wherein the isolation structure laterally surrounds the well region;
    a bit line write region disposed within the well region;
    a bit line read region disposed within the well region and laterally offset from the bit line write region by a non-zero distance;
    a first storage transistor comprising source/drain regions disposed within the bit line write region and a first gate electrode comprised of a first floating gate portion of a floating gate, wherein the source/drain regions of the first storage transistor are disposed on opposing sides of the floating gate, wherein the floating gate overlies the well region of the substrate; and a second storage transistor comprising source/drain regions disposed within the bit line read region and a second gate electrode comprised of a second floating gate portion of the floating gate, wherein the source/drain regions of the second storage transistor are disposed on the opposing sides of the floating gate.

11. The integrated chip of claim 10, wherein the isolation structure comprises a first peripheral isolation segment, a second peripheral isolation segment, and a middle isolation segment disposed laterally between the first and second peripheral isolation segments, wherein the source/drain regions of the first storage transistor are disposed along a first sidewall of the middle isolation segment, and wherein source/drain regions of the second storage transistor are disposed along a second sidewall of the middle isolation segment, wherein the first sidewall is opposite the second sidewall.

12. The integrated chip of claim 11, wherein a first height of the floating gate disposed laterally between the first peripheral isolation segment and the middle isolation segment is less than a second height of the floating gate over the middle isolation segment.

13. The integrated chip of claim 11, wherein a width of the middle isolation segment is less than a width of the first peripheral isolation segment and is less than a width of the second peripheral isolation segment.

14. The integrated chip of claim 11, wherein the well region extends continuously from a sidewall of the first peripheral isolation segment, along a bottom surface of the middle isolation segment, to a sidewall of the second peripheral isolation segment.

15. The integrated chip of claim 11, further comprising:
a first selector transistor including source/drain regions disposed within the bit line write region and a first select gate electrode comprised of a first select gate portion of a select gate, wherein the first selector transistor is disposed along the first sidewall of the middle isolation segment; and
a second selector transistor including source/drain regions disposed within the bit line read region and a second select gate electrode comprised of a second select gate portion of the select gate, wherein the second selector transistor is disposed along the second sidewall of the middle isolation segment.

16. The integrated chip of claim 15, wherein the select gate continuously laterally extends from the second peripheral isolation segment to the middle isolation segment, wherein the select gate is laterally offset from the first peripheral isolation segment by a non-zero distance.

17. A method for forming a memory device, the method comprising:
forming an isolation structure in a substrate, wherein the isolation structure comprises inner sidewalls that demarcate a device region of the substrate;
doping the substrate to form a middle well region within the device region of the substrate;
forming a floating gate over at least a portion of the middle well region and at least a portion of the isolation structure; and
doping the substrate to form a bit line read region within a first portion of the middle well region and a bit line write region within a second portion of the middle well region, wherein the bit line read region includes source/drain regions on opposite sides of the floating gate and the bit line write region includes source/drain regions on the opposite sides of the floating gate, wherein the first portion of the middle well region is laterally offset from the second portion of the middle well region by a non-zero distance.

18. The method of claim 17, wherein the isolation structure comprises a first peripheral isolation segment, a second peripheral isolation segment, and a middle isolation segment disposed between the first and second peripheral isolation segments, wherein the middle isolation segment is disposed laterally between the first portion of the middle well region and the second portion of the middle well region.

19. The method of claim 18, wherein the bit line write region is disposed along a first sidewall of the middle isolation segment, wherein the bit line read region is disposed along a second sidewall of the middle isolation segment, and wherein the first sidewall is opposite the second sidewall.

20. The method of claim 18, further comprising:
forming a dielectric structure between the floating gate and the substrate such that the dielectric structure comprises a first dielectric segment and a second dielectric segment disposed on opposing sides of the middle isolation segment.

* * * * *